United States Patent
Matsui et al.

(10) Patent No.: US 8,871,644 B2
(45) Date of Patent: Oct. 28, 2014

(54) METHOD OF MANUFACTURING SEMICONDUCTOR DEVICE

(71) Applicant: Kabushiki Kaisha Toshiba, Tokyo (JP)

(72) Inventors: Yukiteru Matsui, Nagoya (JP); Akifumi Gawase, Kuwana (JP); Gaku Minamihaba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/016,744

(22) Filed: Sep. 3, 2013

(65) Prior Publication Data

US 2014/0287586 A1   Sep. 25, 2014

(30) Foreign Application Priority Data

Mar. 19, 2013   (JP) ................. 2013-057178

(51) Int. Cl.
H01L 21/302    (2006.01)
H01L 21/461    (2006.01)
H01L 21/306    (2006.01)

(52) U.S. Cl.
CPC ............... H01L 21/30625 (2013.01)
USPC .......................... 438/692; 216/38

(58) Field of Classification Search
USPC ................ 216/88, 38; 438/691, 692
See application file for complete search history.

(56) References Cited

U.S. PATENT DOCUMENTS

| 6,224,464 | B1 | 5/2001 | Nojo et al. |
| 6,350,694 | B1 * | 2/2002 | Chang et al. ............ 438/692 |

FOREIGN PATENT DOCUMENTS

| JP | 2003-007656 | 1/2003 |
| JP | 2005-347568 | 12/2005 |
| JP | 2011-233676 | 11/2011 |
| JP | 2011-248570 | 12/2011 |
| JP | 2010-058189 | 3/2012 |
| JP | 2012-114454 | 6/2012 |
| JP | 2012-132383 | 7/2012 |

OTHER PUBLICATIONS

English-Language Translation of the Abstract for JPH822970, Jan. 23, 1996.

* cited by examiner

*Primary Examiner* — Roberts Culbert
(74) *Attorney, Agent, or Firm* — Finnegan, Henderson, Farabow, Garrett & Dunner, LLP

(57) ABSTRACT

According to one embodiment, a manufacturing method of a semiconductor device comprises forming a to-be-processed film includes a convex potion and concave potion on its surface on a semiconductor substrate via layers having a relative dielectric constant smaller than that of $SiO_2$, planarizing the surface of the to-be-processed film, and etching the planarized surface of the to-be-processed film.

20 Claims, 15 Drawing Sheets

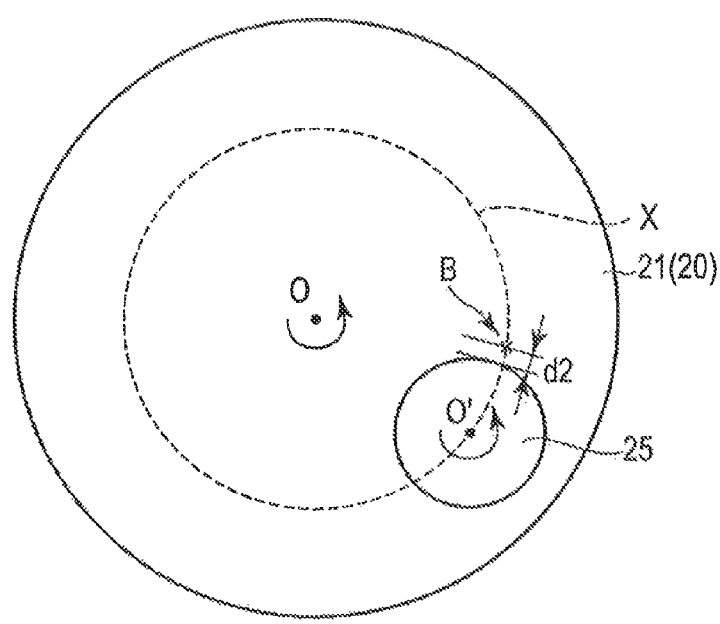
F I G. 17
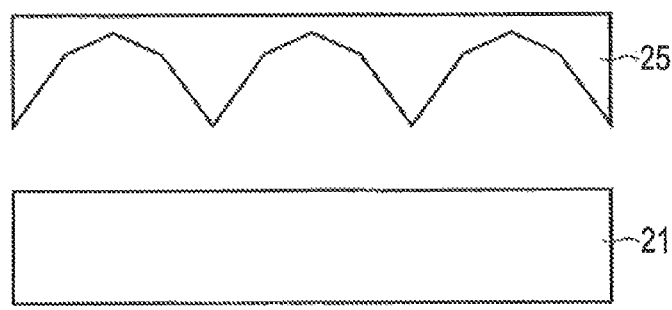
F I G. 18
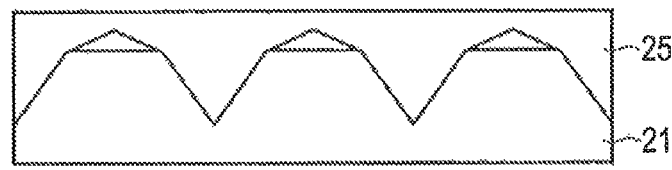
F I G. 19

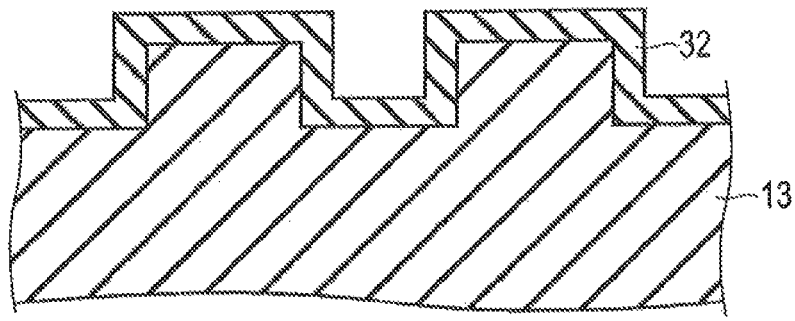
F I G. 22B
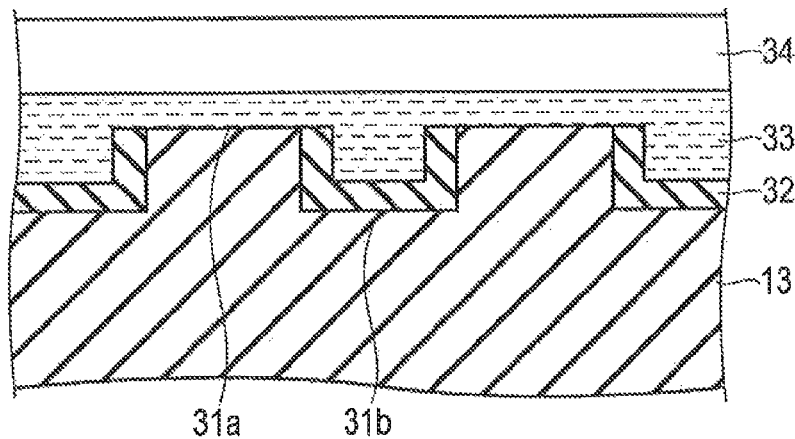
F I G. 22C
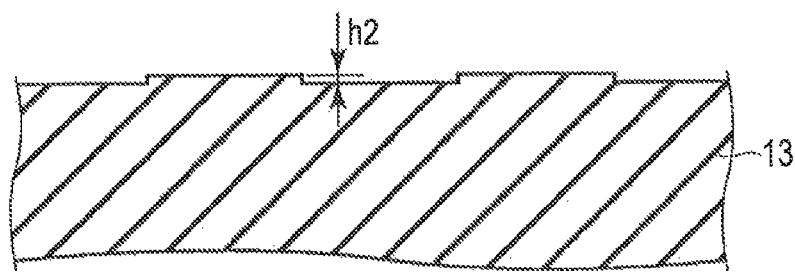
F I G. 22D

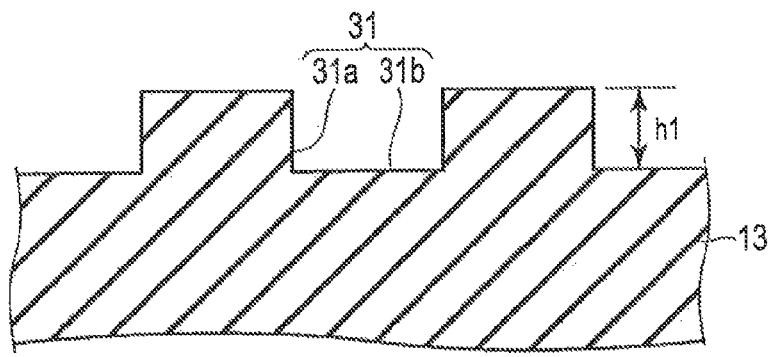
F I G. 23A
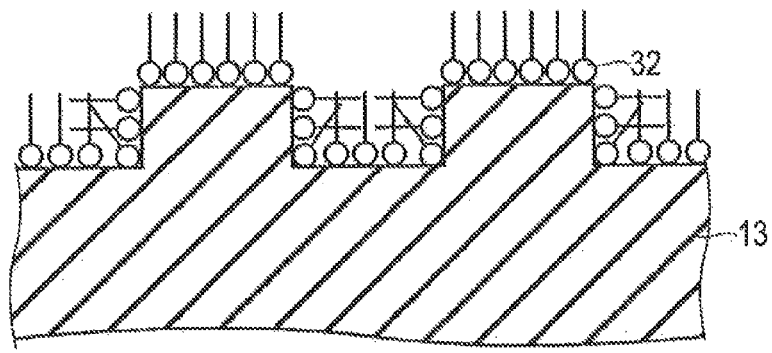
F I G. 23B
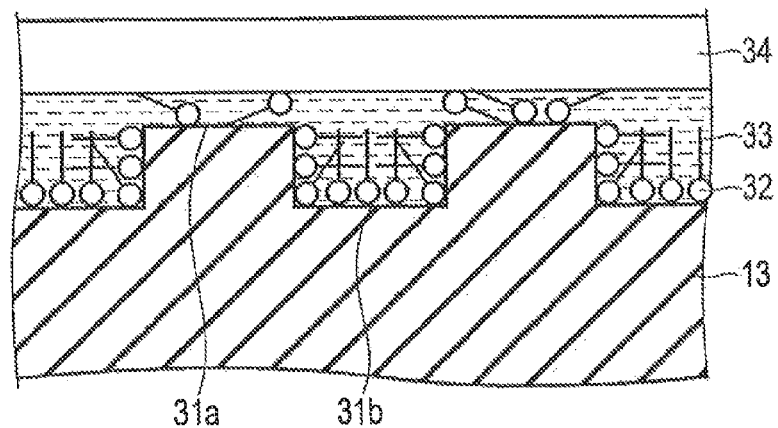
F I G. 23C

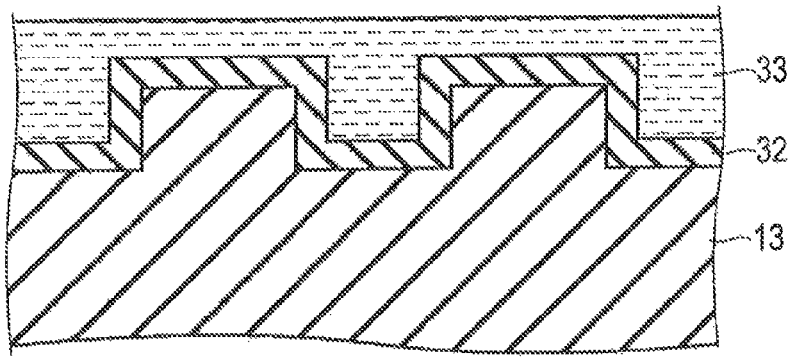
F I G. 25B
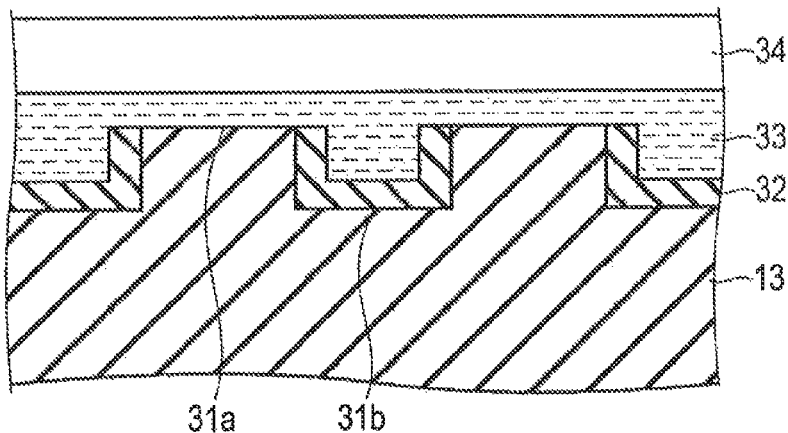
F I G. 25C
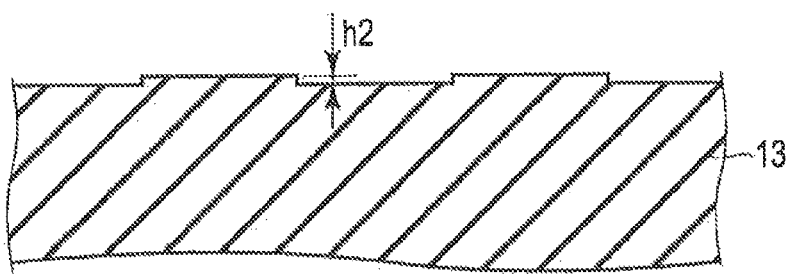
F I G. 25D

METHOD OF MANUFACTURING SEMICONDUCTOR DEVICE

CROSS-REFERENCE TO RELATED APPLICATIONS

This application is based upon and claims the benefit of priority from Japanese Patent Application No. 2013-057178, filed Mar. 19, 2013, the entire contents of which are incorporated heroin by reference.

FIELD

Embodiments described herein relate generally to a manufacturing method of a semiconductor device.

BACKGROUND

In a manufacturing process of a semiconductor device, there is a CMP (Chemical Mechanical Polishing) technology as a planarization technology of a film surface. In the CMP process, for example, silicon oxide ($SiO_2$) and the like formed on a semiconductor substrate are used as a to-be-processed film and the surface of the film is planarized.

However, in the CMP process, a slurry containing abrasive grains is used. Because of this, after the CMP process, the surface of the to-be-processed film is damaged (scratched) by polishing executed using the abrasive grains.

In contrast, recently, in a semiconductor memory, a novel structure is being introduced together with miniaturization to increase a capacity and to reduce a power consumption. In a generation employing a half pitch of 20 nm or less and a generation thereafter, an air gap is introduced as an insulation layer having a low dielectric constant to secure an insulating property between electrodes (wirings).

When such air gap is formed accompanying with miniaturization, a mechanical strength of a device is greatly lowered. For this reason, when a surface of the to-be-processed film on the air gap is planarized by the CMP technology, an air gap portion is shear damaged (cracked) by a shearing stress at the time of the CMP process in addition to the generation of the scratches.

BRIEF DESCRIPTION OF THE DRAWINGS

FIG. 17 is an upper surface view showing the CMP device in the third CMP method;

FIGS. 18, 19, and 20 are sectional views showing conditioning steps of the polishing pad in a fourth CMP method;

FIGS. 22A, 22B, 22C, and 22D are sectional views showing flows in the first chemical polishing method;

FIGS. 23A, 23B, 23C, and 23D are sectional views showing flows in a first chemical polishing method according to a first embodiment;

FIGS. 25A, 25B, 25C, and 25D are sectional views showing flows in a second chemical polishing method;

DETAILED DESCRIPTION

Figure 1:
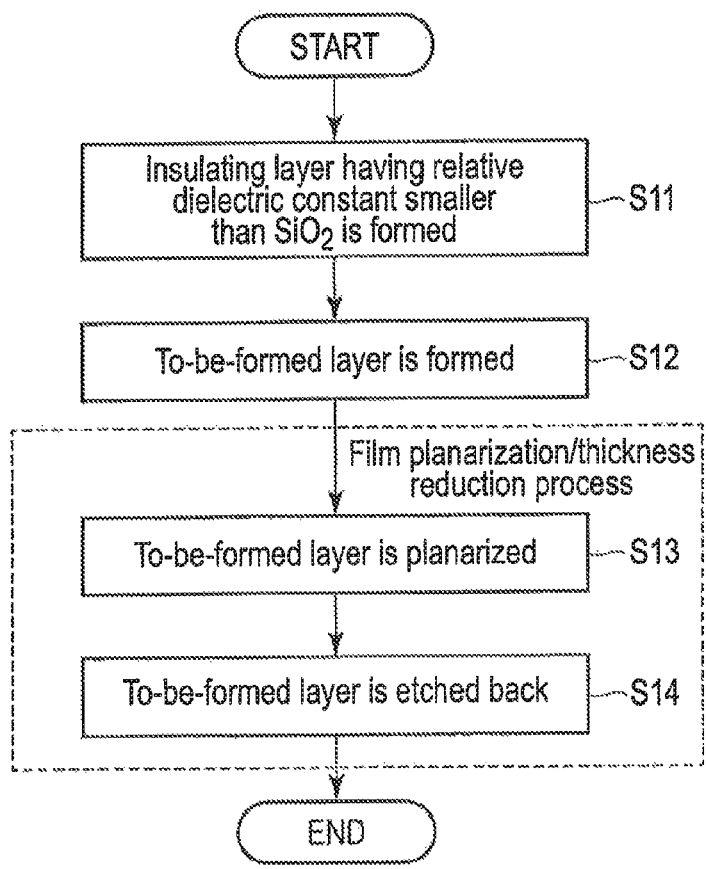
FIG. 1 is a flowchart showing a manufacturing method of a semiconductor device according to an embodiment.

In general, according to one embodiment, a manufacturing method of a semiconductor device comprises forming a to-be-processed film comprising a convex potion and concave potion on its surface on a semiconductor substrate via layers having a relative dielectric constant smaller than that of $SiO_2$, planarizing the surface of the to-be-processed film, and etching the planarized surface of the to-be-processed film.

The embodiment will be explained below referring to the drawings. In the drawings, the same portions are denoted by the same reference symbols. Further, a duplicate explanation will be made as necessary.

Embodiments

Embodiments will be explained using FIGS. 1 to 27. The embodiments are a film planarization/thickness reduction method of a to-be-processed film 13 which is formed on an insulation layer (for example, an air gap 14 or a porous layer 15) that has a relative dielectric constant smaller than that of silicon oxide ($SiO_2$) and a low mechanical strength. More specifically, the film planarization/thickness reduction method has a step of planarizing the to-be-processed film 13 having a convex potion and concave potion on the air gap 14 or the porous layer 15 by a predetermined planarization method and a step of thinning the to-be-processed film 13 by etching back the to-be-processed film 13. With these steps, a desired flatness can be obtained while suppressing scratches and cracks generated to the to-be-processed film 13. The embodiments will be explained below in detail.

[1. Method of Manufacturing Semiconductor Device According to Embodiment]

A manufacturing method of a semiconductor device according to an embodiment will be explained below using FIGS. 1 to 8.

First, an outline of the manufacturing method of the semiconductor device according to the embodiment will be explained using FIG. 1.

FIG. 1 is a flowchart showing the manufacturing method of the semiconductor device according to the embodiment.

As shown in FIG. 1, first, at step S11, an insulation layer having a relative dielectric constant smaller than that of $SiO_2$ is formed on a semiconductor substrate 10. The insulation layer is the air gap 14 or the porous layer 15. Next, at step S12, the to-be-processed film 13 is formed on the insulation layer. The to-be-processed film 13 has a convex potion and concave potion on its surface. Next, the to-be-processed film 13 is subjected to a film planarization/thickness reduction process. More specifically, at step S13, the to-be-processed film is planarized by a predetermined planarization method. The predetermined planarization method will be described later in detail. Thereafter, at step S14, the to-be-processed film is etched back.

Next, the manufacturing method of the semiconductor device according to the embodiment will be more specifically explained using FIGS. 2 to 8.

Figure 2:
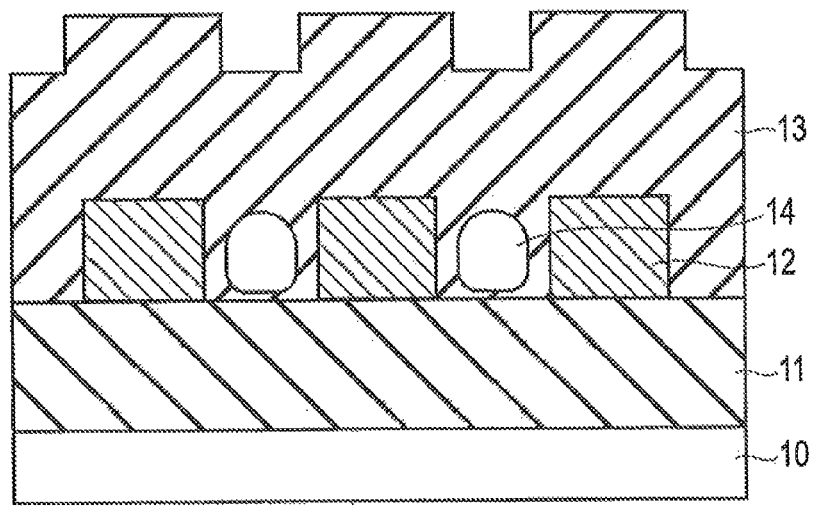
FIGS. 2, 3, and 4 are sectional views showing an example of manufacturing steps of the semiconductor device according to the embodiment.
Figure 3:
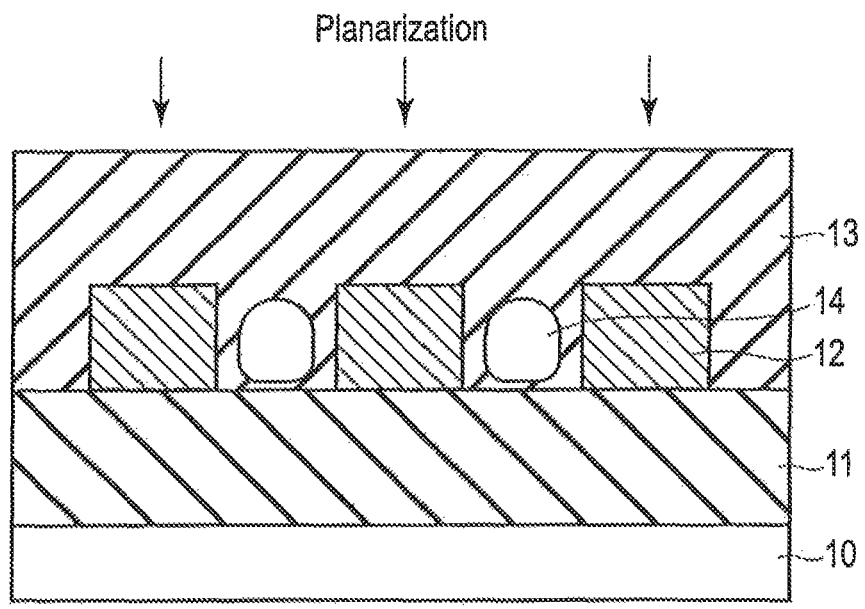
Figure 4:
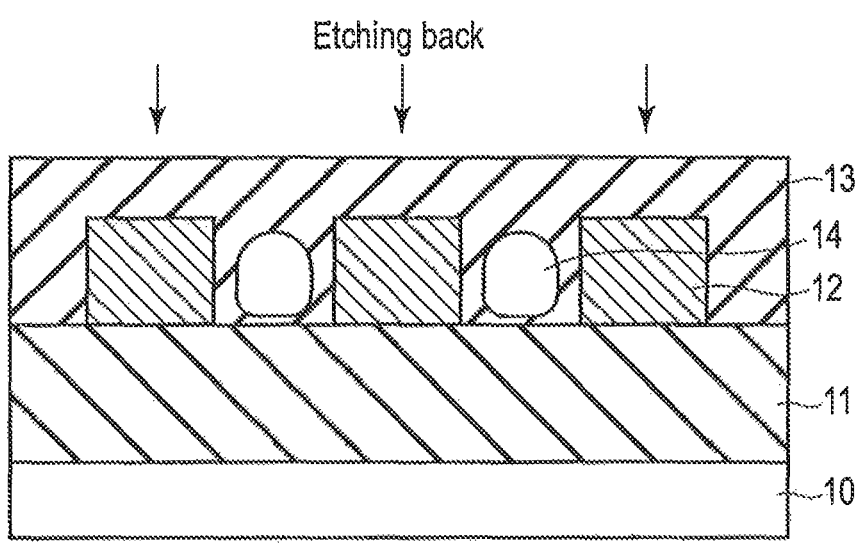

FIGS. 2 to 4 are sectional views showing an example of manufacturing steps of the semiconductor device according to the embodiment. FIGS. 5 to 8 are sectional views showing another example of the manufacturing steps of the semiconductor device according to the embodiment. More specifically, FIGS. 2 to 4 show an example for forming the air gap 14 as an insulation layer having a relative dielectric constant smaller than that of $SiO_2$. Further, FIGS. 5 to 8 show an example for forming a porous layer 15 as an insulation layer having a relative dielectric constant smaller than that of $SiO_2$. Forming the porous layer 15 lowers the mechanical strength like forming the air gap 14.

When the air gap 14 is formed as the insulation layer having the relative dielectric constant smaller than that of $SiO_2$, first, as shown in FIG. 2, wirings 12 made of, for example, W are formed on the semiconductor substrate 10 via an insulation layer 11. The wirings 12 are formed by being patterned by RIE using a not shown resist as a mask after they have been formed on an entire surface of the insulation layer 11. The thickness (height) of the wirings 12 is, for example, about 400 nm.

Next, an interlayer insulation layer (to-be-processed film) 13 is formed so as to cover the wirings 12. At this time, the interlayer insulation layer 13 is made of $SiO_2$ which is formed by a method with a low coverage, for example, a P-CVD (Plasma-Chemical Vapor Deposition) method. The air gap 14 is formed between adjacent wirings 12 by the film forming method (step S11 in FIG. 1). As a result, an insulating property between the wirings can be improved. In other words, the interlayer insulation layer 13 is formed on the air gap 14 between a wiring 12 and a wiring 12 (step S12 in FIG. 1). The thickness of the interlayer insulation layer 13 is, for example, about 780 nm.

At this time, a convex potion and concave potion are formed on a surface of the interlayer insulation layer 13 by forming the wirings 12 on the insulation layer 11. More specifically, convex portions are formed above region where the wirings 12 are formed and concave portions (grooves) are above region other than the region where the wirings 12 are formed.

Next, the interlayer insulation layer 13 having the convex potion and concave potion are planarized and thinned.

More specifically, first, as shown in FIG. 3, the interlayer insulation layer 13 is planarized by a predetermined planarization method (step S13 in FIG. 1). The predetermined planarization method is, for example, a CMP method (first planarization method to be described later) or a chemical polishing method (second planarization method to be described later) capable of reducing the number of scratches. The methods will be described later in detail. With the methods, the convex potion and concave potion of the surface of the interlayer insulation layer 13 is removed and the surface is planarized while reducing the number of the scratches generated on the surface of the interlayer insulation layer 13.

At this time, a larger thickness of the interlayer insulation layer 13 on the air gap 14 more reduces a shearing stress applied to the air gap 14 by the planarization method. In the example, the thickness of the interlayer insulation layer 13 which remains on the air gap 14 after the predetermined planarization method is made sufficiently thick and is set to, for example, about 480 nm. In this way, the shearing stress applied to the air gap 14 portion at the time of the predetermined planarization method can be reduced. That is, the number of cracks generated to the air gap 14 by the shearing stress at the time of the predetermined planarization method can be reduced.

Next, as shown in FIG. 4, the interlayer insulation layer 13 is etched back (step S14 in FIG. 1). Although the etching back is a dry etching having anisotropy, for example, RIE and the like, the etching back is not limited thereto and may be a wet etching. Note that, for example, $CF_4$ is used as an etching gas for the dry etching. In this way, the surface of the interlayer insulation layer 13 is removed while keeping a flatness. As a result, a thickness of the interlayer insulation layer 13 can be reduced to a desired thickness. The thickness of the interlayer insulation layer 13 on the wirings 12 (air gap 14) which remains after etching back is, for example, about 280 nm. Here, in the etching back which is a noncontact process, scratches due to abrasive grains and cracks due to a shearing stress are not generated, which differs from the planarization method.

Note that the thickness of the interlayer insulation layer 13 on the air gap 14 at the time the predetermined planarization method is switched to the etching back is not limited to about 480 nm. To reduce the shearing stress applied to the air gap 14 at the time of the predetermined planarization method, the predetermined planarization method is preferably switched to the etching back when the thickness of the interlayer insulation layer 13 on the air gap 14 is as thick as possible. Accordingly, it is preferable that the predetermined planarization method is switched to the etching back at the same time that the convex potion and concave potion is removed to such a degree that the surface of the interlayer insulation layer 13 has a sufficient flatness by the predetermined planarization method.

The film planarization/thickness reduction process according to the embodiment is executed as described above, and an example of the semiconductor device is manufactured.

Figure 5:
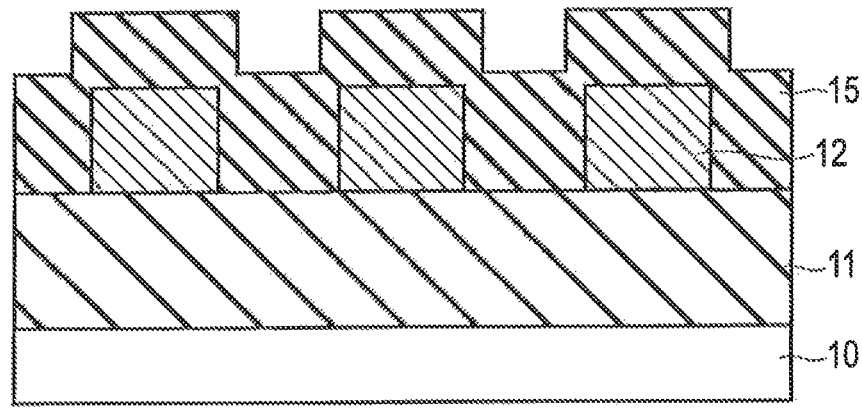
FIGS. 5, 6, 7, and 8 are sectional views showing another example of the manufacturing steps of the semiconductor device according to the embodiment.

When the porous layer 15 is formed as the insulation layer having the relative dielectric constant smaller than that of $SiO_2$, first, as shown in FIG. 5, the wirings 12 made of, for example, W are formed on the semiconductor substrate 10 via the insulation layer 11. The wirings 12 are formed by being patterned by RIE using a not shown resist as a mask after they have been formed on the entire surface of the insulation layer 11. The thickness (height) of the wirings 12 is, for example, about 400 nm.

Next, the porous layer 15 is formed so as to cover the wirings 12 (step S11 in FIG. 1). The porous layer 15 contains, for example, SiOC or SiN. In this way, the porous layer 15 is buried between adjacent wirings 12. As a result, the insulating property between the wirings can be improved. At the time, a convex potion and concave potion is formed on a surface of the porous layer 15 by forming the wirings 12 on the insulation layer 11. More specifically, convex portions are formed above region where the wirings 12 are formed and concave portions (grooves) are above region other than the region where the wirings 12 are formed.

Figure 6:
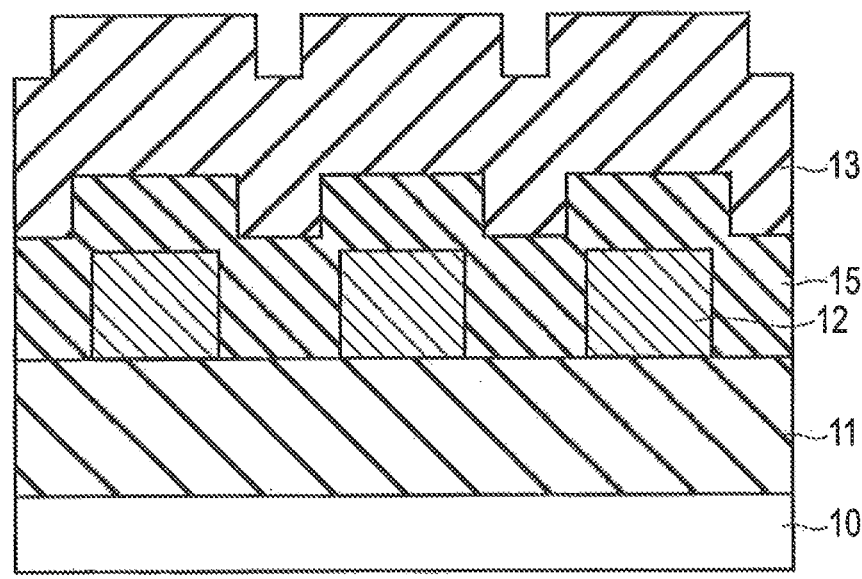

Next, as shown in FIG. 6, the interlayer insulation layer (to-be-processed film) 13 made of $SiO_2$ is formed on the porous layer 15 so as to cover the porous layer 15 (step S12 in FIG. 1). At the time, since the surface of the porous layer 15 has the convex potion and concave potion, a convex potion and concave potion is formed on the surface of the interlayer insulation layer 13 reflecting the above convex potion and concave potion on the surface of the porous layer 15. More specifically, in the interlayer insulation layer 13, an above region of the convex portions of the porous layer 15 becomes convex portions, and an above region of the concave portions of the porous layer 15 becomes concave portions. Further, the cumulated thickness of the porous layer 15 and the interlayer insulation layer 13 is, for example, about 780 nm.

Next, the interlayer insulation layer 13 having the convex potion and concave potion are subjected to the film planarization/thickness reduction process.

Figure 7:
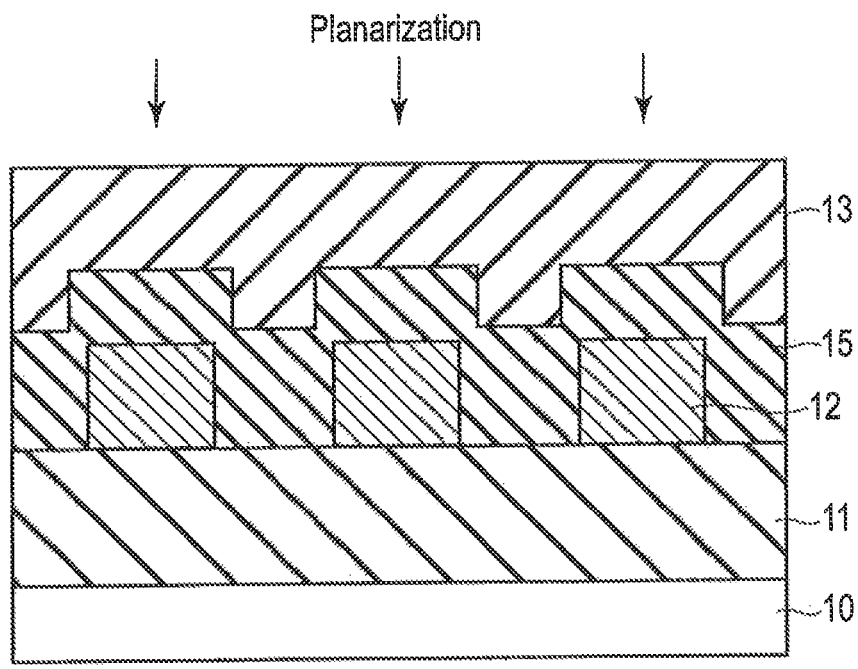

More specifically, first, as shown in FIG. 7, the interlayer insulation layer 13 is planarized by a predetermined planarization method (step S13 in FIG. 1). The predetermined planarization method is, for example, a CMP method or a chemical polishing method capable of reducing scratches. The methods will be described later in detail. With the methods, the convex potion and concave potion of the surface of the interlayer insulation layer 13 is removed and the surface is planarized while reducing the scratches generated on the surface of the interlayer insulation layer 13.

At this time, the thickness of the interlayer insulation layer 13 which remains on the porous layer 15 after the predetermined planarization method is made sufficiently thick and is set to, for example, about 480 nm. In this way, a shearing stress applied to the portion of the porous layer 15 in the predetermined planarization method can be reduced. That is, the cracks generated to the portion of the porous layer 15 by a shearing stress when the predetermined planarization method is executed can be reduced.

Figure 8:
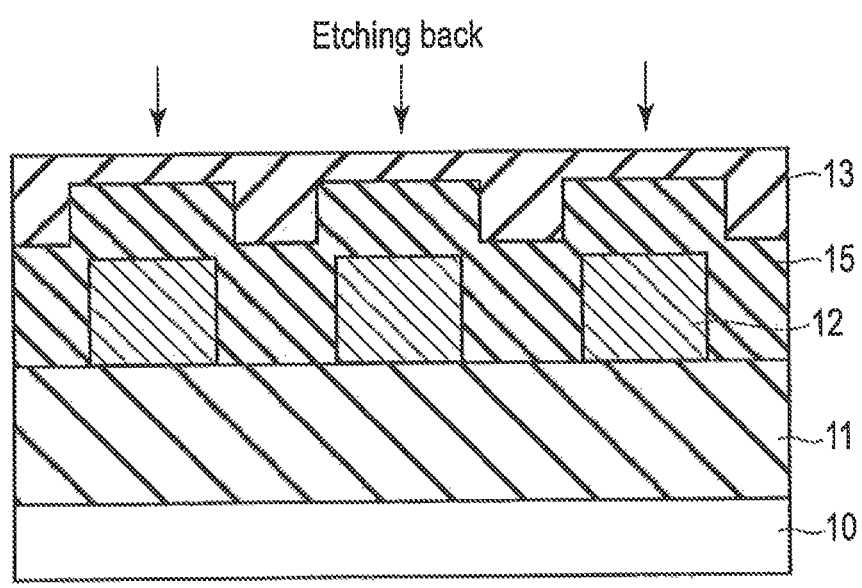

Next, as shown in FIG. 8, the interlayer insulation layer 13 is etched back (step S14 in FIG. 1). Although the etching back is a dry etching having anisotropy, for example, RIE and the like, the etching back is not limited thereto and may be a wet etching. In this way, the surface of the interlayer insulation layer 13 is removed while keeping a flatness. As a result, a thickness of the interlayer insulation layer 13 can be reduced to a desired thickness. The thickness of the interlayer insulation layer 13 on the porous layer 15 which remains after the etching back is, for example, about 280 nm.

The film planarization/thickness reduction process according to the embodiment is executed as described above, and another example of the semiconductor device is manufactured.

As described above, according to the embodiment, in the film planarization/thickness reduction process of the to-be-processed film 13 on the air gap 14 or the porous layer 15, the predetermined planarization method and the etching back method are executed. In this way, the scratches generated on the surface of the interlayer insulation layer 13 can be reduced and the cracks generated to the air gap 14 or the porous layer 15 portion can be reduced.

[2. First Planarization Method]

A first planarization method according to the embodiment will be explained below using FIGS. 9 to 20. The first planarization method is a CMP method which polishes the to-be-processed film 13 by bringing the polishing pad 21 into contact with the to-be-processed film 13 after a surface of the polishing pad 21 has been conditioned so that an Rsk value becomes negative. In this way, the number of scratches on the surface of the to-be-processed film 13 after the CMP method has been executed can be reduced. First to fourth CMP methods will be explained below as the first planarization method.

[2-1. First CMP Method]

First, the first CMP method will be explained using FIGS. 9 to 14.

[2-1(1). CMP Device in First CMP Method]

A CMP device in the first CMP method will be explained below using FIGS. 9 and 10.

Figure 9:
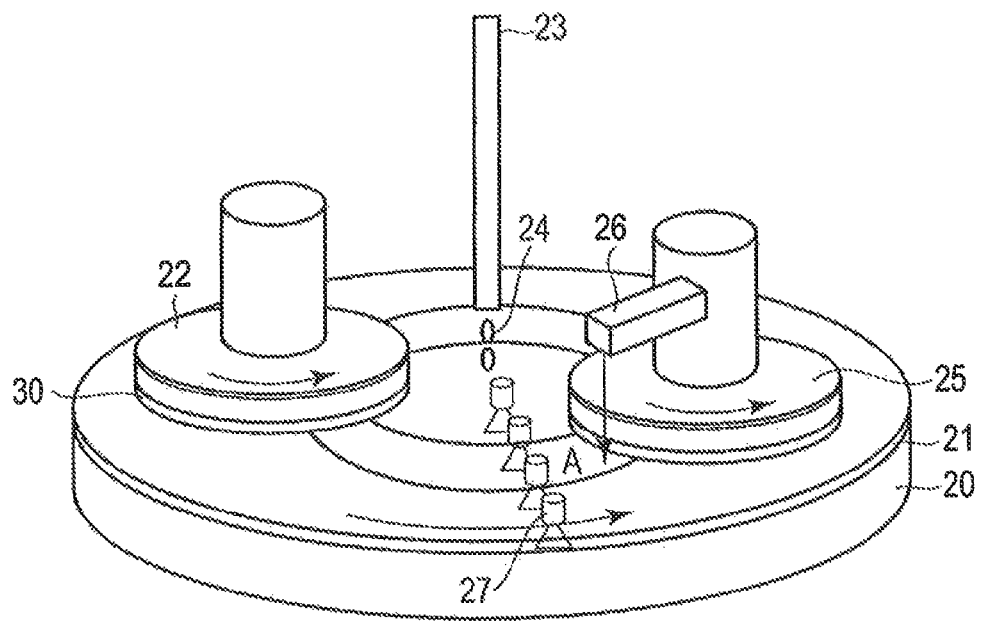
FIG. 9 is a configuration view showing a CMP device in a first CMP method.

FIG. 9 is a configuration view showing the CMP device in the first CMP method. FIG. 10 is an upper surface view showing the CMP device in the first CMP method.

As shown in FIG. 9, the CMP device in the first CMP method includes a turntable 20, a polishing pad 21, a head 22, a slurry supply nozzle 23, a dresser 25, a polishing pad temperature measuring device 26, and vapor supply nozzles 27.

The head 22 to which a wafer 30 (semiconductor substrate 10) is held is in contact with the polishing pad 21 bonded on the turntable 20. On a surface of the semiconductor substrate 10, the air gap 14 or the porous layer 15 and the to-be-processed film 13 made of $SiO_2$ on the air gap 14 or the porous layer 15 are formed. The contact of the to-be-processed film 13 on the polishing pad 21 causes the to-be-processed film 13 to be polished. The turntable 20 can rotate at 1-200 rpm, and the head 22 can rotate at 1-200 rpm. The turntable 20 and the head 22 rotate in the same direction, respectively and rotate, for example, counterclockwise. Further, while the to-be-processed film 13 is being polished, the turntable 20 and the head 22 rotate in a predetermined direction. A polish load of the turntable 20 and the head 22 is ordinarily about 50-500 hPa.

Further, the slurry supply nozzle 23 is disposed above the polishing pad 21. While the to-be-processed film 13 is being polished, a predetermined liquid medicine as a slurry 24 can be supplied from the slurry supply nozzle 23 at a flow rate of 50-1000 cc/min. Note that although the slurry supply nozzle 23 is disposed near to the center of the turntable 20, the slurry supply nozzle 23 may be appropriately disposed so that the slurry 24 can be supplied to an entire surface of the polishing pad 21 in addition to the above disposition.

The dresser 25 conditions the surface of the polishing pad 21 by being brought into contact with the polishing pad 21. The dresser 25 can rotate at 1-200 rpm. The dresser 25 rotates, for example, counterclockwise. Further, during the conditioning, the turntable 20 and the dresser 25 rotate in a predetermined direction. A dressing load of the turntable 20 and the dresser 25 is ordinarily about 50-500 hPa. Although the dresser 25 is, for example, a diamond dresser, the dresser 25 is not limited thereto and may be a ceramic dresser. As a material of the ceramic dresser, ceramic, for example, SiC and the like is used.

Further, the polishing pad temperature measuring device 26 that is an infrared radiation thermometer is installed to a column portion (dresser drive shaft) connected to the dresser 25. The polishing pad temperature measuring device 26 will be described later in detail.

Further, the vapor supply nozzles 27 for ejecting a vapor, and the like prepared by heating pure water toward the polishing pad 21 are disposed above the polishing pad 21. The vapor supply nozzles 27 are disposed on a radius of the polishing pad 21 about a center of the slurry supply nozzle 23 (rotating shaft of the turntable 20). For this reason, the vapor and the like can be ejected on the entire surface of the polishing pad 21 by rotating the polishing pad 21. The vapor supply nozzles 27 are disposed upstream in the rotating direction of the turntable 20 to the polishing pad temperature measuring device 26 (dresser 25). With this configuration, the surface temperature of the polishing pad 21 measured by the polishing pad temperature measuring device 26 can be adjusted during the conditioning by controlling the vapor supply nozzles 27.

Further, a not shown dressing liquid supply nozzle is disposed above the polishing pad 21. The dressing liquid supply nozzle supplies various dressing liquids during the conditioning.

Note that the upstream side in the rotating direction of the turntable 20 to the dresser 25 is a region within 180° C. upstream in the rotating direction of the turntable 20 to the dresser 25.

Figure 10:
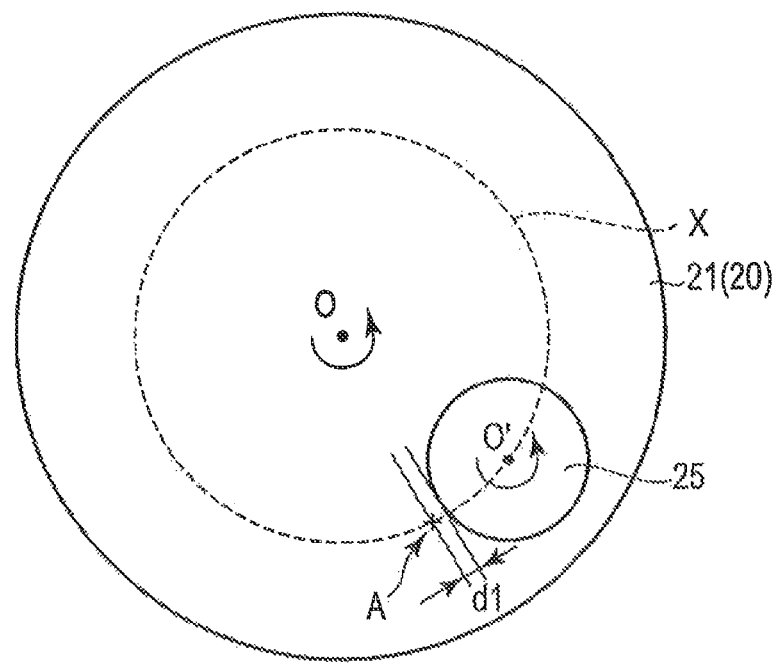
FIG. 10 is an upper surface view showing the CMP device in the first CMP method.

As shown in FIG. 10, the polishing pad temperature measuring device 26 is disposed upstream in the rotating direction of the turntable 20 to the dresser 25. For this reason, the polishing pad temperature measuring device 26 measures the surface temperature (inlet temperature) of the polishing pad 21 upstream in the rotating direction of the turntable 20 to the dresser 25. Further, the polishing pad temperature measuring device 26 is disposed downstream in the rotating direction of the turntable 20 to the vapor supply nozzles 27. That is, the polishing pad temperature measuring device 26 measures the surface temperature of the polishing pad 21 before it comes into contact with the dresser 25 after it has been heated by the vapor of the vapor supply nozzles 27.

Further, the polishing pad temperature measuring device 26 measures the temperature of the polishing pad 21 on a circular orbit X that passes through a center O' of the dresser 25 and has a predetermined distance about a center O of the turntable 20. This is because the dresser 25 is in contact with the polishing pad 21 for a long time on the circular orbit X and the highest temperature can be measured.

Further, a dressing liquid collides against the dresser 25 and swells in the vicinity of an end portion of the dresser 25. For this reason, when a temperature is measured in the vicinity of the end portion of the dresser 25, there is a possibility that the polishing pad temperature measuring device 26 erroneously measures the temperature of the dressing liquid in place of measuring the surface temperature of the polishing pad 21. To measure the surface temperature of the polishing pad 21, the polishing pad temperature measuring device 26 preferably measures the temperature at an inlet temperature measurement point A which is positioned on the circular orbit X and away from the dressing liquid by a distance d1 (for example, 10 mm).

[2-1(2). Flow in First CMP Method]

A flow in the first CMP method will be explained below using FIGS. 11, 12A, and 12B.

Figure 11:
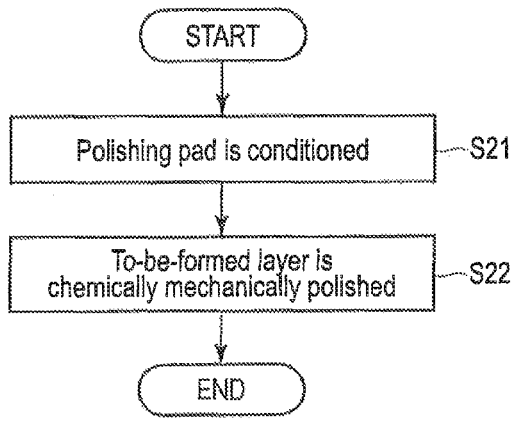
FIG. 11 is a flowchart in the first CMP method.

FIG. 11 is a flowchart in the first CMP method.

As shown in FIG. 11, first, at step S21, the polishing pad 21 is conditioned. More specifically, the dresser 25 is brought into contact with the surface of the polishing pad 21, and the dresser 25 and the polishing pad 21 are slid (for example, rotated). Further, the vapor prepared by heating pure water is supplied onto the surface of the polishing pad 21 by the vapor supply nozzles 27.

As the polishing pad 21, for example, a material which is mainly made of polyurethane and has a Shore D hardness of 50 or more to 80 or less and an elastic modulus of 200 MPa or more to 700 MPa or less is bonded to the turntable 20. The number of revolutions of the turntable 20 is set to, for example, 10 rpm or more to 110 rpm or less. As the dresser 25, for example, a diamond having a roughness of 100 or more to 200 or less (made by Asahi Diamond) is used. Further, the number of revolutions of the dresser 25 is set to, for example, 10 rpm or more to 110 rpm or less, and a dressing load is set to 50 hPa or more to 300 hPa or less. Further, a conditioning time is set to, for example, 60 seconds.

At this time, the supply temperature and the supply amount of the vapor supplied by the vapor supply nozzles 27 are controlled so that the surface temperature of the polishing pad 21 (temperature at the inlet temperature measurement point A measured by the polishing pad temperature measuring device 26) becomes 40° C. or more to 80° C. or less. With this control, the Rsk value of the surface of the polishing pad 21 can be made 0 or less (negative).

Next, at step S22, the to-be-processed film 13 is chemically mechanically polished (CMP). More specifically, the to-be-processed film 13 held by the head 22 is brought into contact with the polishing pad 21 having been conditioned, and the to-be-processed film 13 and the polishing pad 21 are slid. Here, the number of revolutions of the head 22 is set to, for example, 120 rpm, and a polishing load is set to 300 gf/cm$^2$. Further, the slurry 24 is supplied from the slurry supply nozzle 23 at a flow rate of 100 cc/min. The slurry 24 contains, for example, cerium oxide (DLS2 made by Hitachi Chemical Company, Ltd.) and polycarbonxylic acids ammonium (TK75 made by Kao Corporation) as the abrasive grains.

In this way, the number of scratches on the surface of the to-be-processed film 13 having been polished can be reduced by polishing the surface of the to-be-processed film 13 by bringing the surface of the to-be-processed film 13 into contact with the surface of the polishing pad 21 which rotates while being provided with the negative Rsk value. The above will be explained in more detail later.

Figure 12:
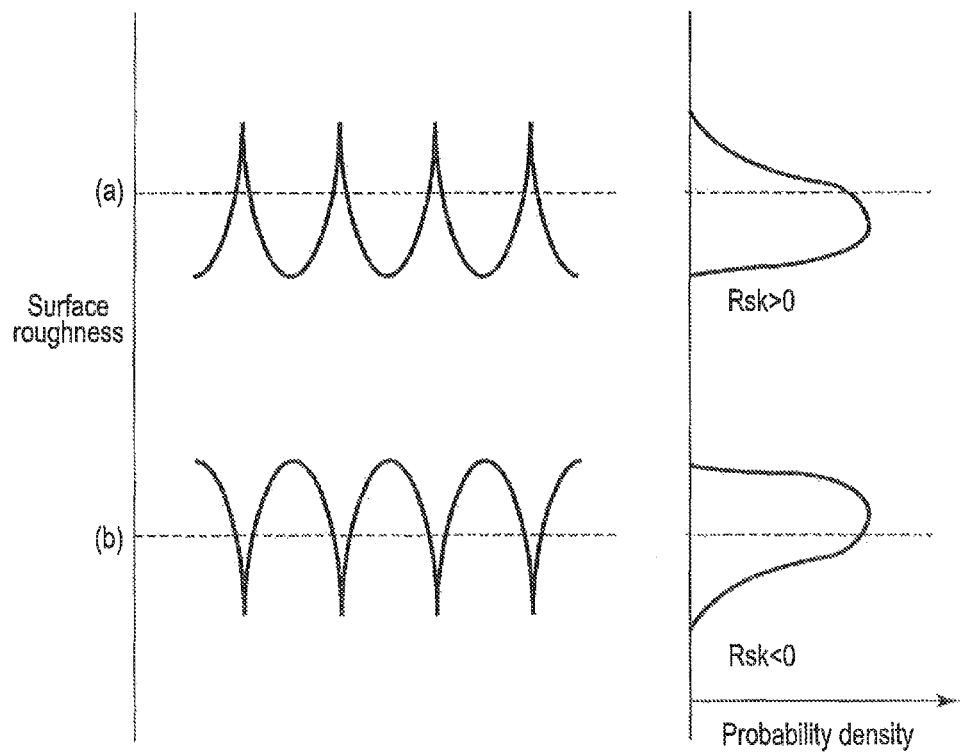
FIG. 12 is a view explaining an Rsk value.

FIG. 12 is view explaining the Rsk value.

The Rsk value (roughness curve skew value) shows the relativity of a probability density distribution to the average line of a surface roughness profile.

As shown in FIG. 12A, when the probability density distribution is biased below the average line of the surface roughness profile, it is said that the Rsk value is positive. At this time, convexly-projecting portions are increased and flat portions are reduced.

In contrast, as shown in FIG. 12B, when the probability density distribution is biased above the average line of the surface roughness profile, it is said that the Rsk value is negative. At this time, convexly-projecting portions are reduced and flat portions are increased.

That is, a negative Rsk value results in a more smooth surface than a positive Rsk value.

[2-1(3). Basis of Conditions in First CMP Method]

Basis of conditions in the first CMP method will be explained below using FIGS. 13 and 14.

First, a polishing experiment was executed to examine the relation between the Rsk value of the surface of the polishing pad 21 and the number of scratches on the surface of the to-be-processed film 13.

Figure 13:
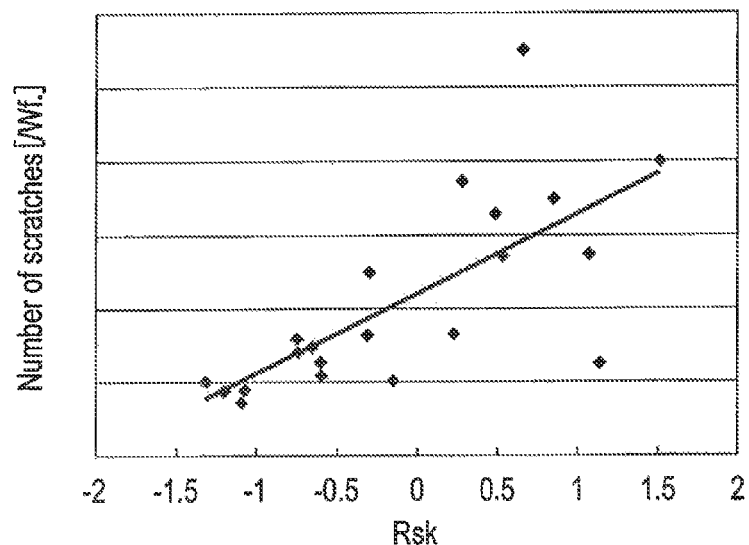
FIG. 13 is a graph showing the relation between an Rsk value of a surface of a polishing pad and the number of scratches of a surface of a to-be-processed film which is obtained by a polish experiment.

FIG. 13 is a graph showing the relation between the Rsk value of the surface of the polishing pad 21 and the number of scratches on the surface of the to-be-processed film 13 obtained by the polishing experiment. The Rsk value was calculated from the roughness measured by a laser microscope with a wide field of view, for example, HD100D (made by Lasertech Corporation). The number of scratches was counted by KLA2815 (made by KLA-Tencor Corporation, SEM Review) after the surface of the to-be-processed film 13 had been lightly etched once in dilute hydrofluoric acid after the CMP process.

As shown in FIG. 13, when the surface of the to-be-processed film 13 is polished by being brought into contact with the surface of the polishing pad 21, a positive correlation (correlation coefficient: 0.71) exists between the Rsk value of the surface of the polishing pad 21 at the time of polishing and the number of scratches on the surface of the to-be-processed film 13 which have been generated as a result of the polishing. In other words, an increase in the Rsk value of the polishing pad 21 increases the number of scratches on the surface of the to-be-processed film 13, and vice versa. Further, an increase in the Rsk value of the surface of the polishing pad 21 to a negative side (as the Rsk becomes negative with a larger absolute value) reduces the number of scratches on the surface of the to-be-processed film 13 and reduces a dispersion of the number of scratches.

In this way, the number of scratches on the surface of the to-be-processed film 13 can be reduced by polishing the to-be-processed film 13 in a state that the Rsk value of the surface of the polishing pad 21 is negative with a larger absolute value. Accordingly, it is desired to make the Rsk value of the surface of the polishing pad 21 negative with a larger absolute value by conditioning.

Next, a conditioning experiment was executed to examine the relation between the surface temperature of the polishing pad 21 and the Rsk value of the polishing pad 21. The surface temperature of the polishing pad 21 measured by the polishing pad temperature measuring device 26 was adjusted by controlling the vapor supplied from the vapor supply nozzles 27 in the CMP device described above. Further, a conditioning experiment was executed under the following conditions.

Polishing pad: polyurethane (Shore D hardness; 60, elastic modulus; 400 MPa)
Turntable rpm: 20 rpm
Dresser: diamond roughness: 100 (made by Asahi Diamond)
Dresser load: 200 hPa
Dresser rpm: 20 rpm
Dressing liquid: pure water of 23° C. (room temperature)

Conditioning experiments were executed for 60 seconds in a case that heating was executed by a vapor and a case that heating was not executed by a vapor, respectively. In the respective conditioning experiments, the surface temperature of the polishing pad 21 measured by the polishing pad temperature measuring device 26 was 23° C. (not heated by vapor) and 60° C. (heated by vapor).

Figure 14:
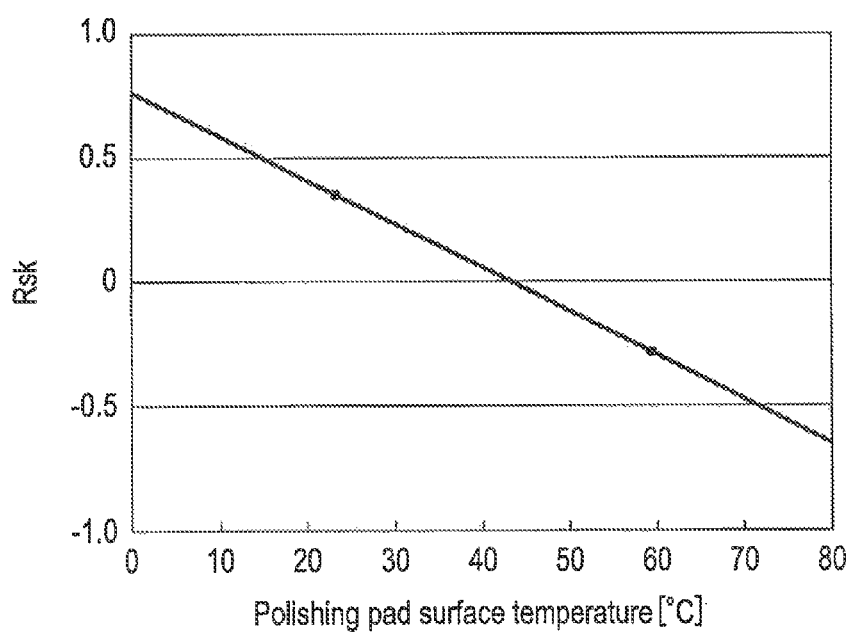
FIG. 14 is a graph showing the relation between a surface temperature of the polishing pad and an Rsk value of the polishing pad obtained by a conditioning experiment.

FIG. 14 is a graph showing the relation between the surface temperature of the polishing pad 21 and the Rsk value of the polishing pad 21 obtained by the conditioning experiment.

As shown in FIG. 14, when the surface of the polishing pad 21 is conditioned by the dresser 25, a negative correlation exists between the surface temperature of the polishing pad 21 at the time of conditioning and the Rsk value of the polishing pad 21 resulting from the conditioning. In other words, an increase in the surface temperature of the polishing pad 21 reduces the Rsk value of the polishing pad 21, and vice versa. More specifically, when the surface temperature of the polishing pad 21 is 23° C. and 66° C., respectively, the Rsk value of the polishing pad 21 is 0.32 and −0.32.

In this way, it is preferable to make the Rsk value of the surface of the polishing pad 21 negative with a larger absolute value by the conditioning. The Rsk value of the surface of the polishing pad 21 can be made negative with a larger absolute value by further increasing the surface temperature of the polishing pad 21 in the conditioning. Note that, as shown in the drawing, in the conditioning, the Rsk value of the surface of the polishing pad 21 can be made negative by making the surface temperature of the polishing pad 21 to 40° C. or more.

In contrast, the grinding speed of the polishing pad 21 in the conditioning depends on the surface temperature of the polishing pad 21. An increase in the surface temperature of the polishing pad 21 reduces the grinding speed, and vice versa. It is considered that this is because an increase in the surface temperature of the polishing pad 21 makes the polishing pad 21 soft (elastic modulus is lowered), which makes it difficult to execute grinding. That is, an increase in the surface temperature of the polishing pad 21 can prolong the use lifetime of the polishing pad 21.

Further, increasing the surface temperature of the polishing pad 21 changes the physical properties of a material of the polishing pad 21 and makes it soft. As a result, the abrasion speed of the dresser 25 which is brought into contact with the polishing pad 21 is reduced. Accordingly, the use lifetime of the dresser 25 can be prolonged. Thus, a dresser having a shore lifetime such as a non-diamond dresser (for example, a dresser made of a ceramic material) can be sufficiently used within its lifetime as the dresser 25 in addition to the diamond dresser.

Note that, in the conditioning, when the surface temperature of the polishing pad 21 is made higher than 80° C., the physical properties of the material of the polishing pad 21 change more. This is because the material of the polishing pad 21 has a glass transition point higher than 80° C. The glass transition point is a phenomenon by which a material changes from a viscous or elastic state to a hard and relatively brittle state in an amorphous region in which a polymer is partially crystallized. That is, when the surface temperature of the polishing pad 21 exceeds 80° C., the elastic modulus of the material of the polishing pad 21 is greatly lowered and the physical properties of the material differ largely from those of the original material. As a result, the surface of the polishing pad 21 cannot be sufficiently conditioned. For this reason, in the conditioning, it is preferable to set the surface temperature of the polishing pad 21 to 80° C. or less.

As described above, the Rsk value of the polishing pad 21 can be made negative with a larger absolute value and the grinding speed of the polishing pad 21 can be reduced by executing the conditioning while increasing the surface temperature of the polishing pad 21 within a range of 40° C. or more to 80° C. or less.

[2-1(4). Effect in First CMP Method]

According to the first CMP method, the surface of the polishing pad 21 is conditioned at a high temperature within the range of 40° C. or more to 80° C. or leas by supplying the water vapor onto the surface of the polishing pad 21. Thereafter, the to-be-processed film 13 is polished by bringing the surface of the to-be-processed film 13 into contact with the surface of the polishing pad 21 having being conditioned. In this way, the following effect can be obtained.

The Rsk value of the surface of the polishing pad 21 can be made a negative value having a larger absolute value by conditioning the surface of the polishing pad 21 at a higher temperature. The number of scratches on the surface of the to-be-processed film 13 can be reduced after the CMP process by polishing the to-be-processed film 13 by bringing the surface of the to-be-processed film 13 into contact with the surface of the polishing pad 21 provided with the negative Rsk value. As a result, a reduction in yield and reliability of the device can be suppressed.

[2-2. Second CMP Method]

Next, a second CMP method will be explained using FIGS. 11 and 15. Note that, in the second CMP method, an explanation of the same points as those of the first CMP method is omitted, and different points will be mainly explained.

[2-2(1). CMP Device in Second CMP Method]

A CMP device in the second CMP method will be explained below using FIG. 15.

Figure 15:
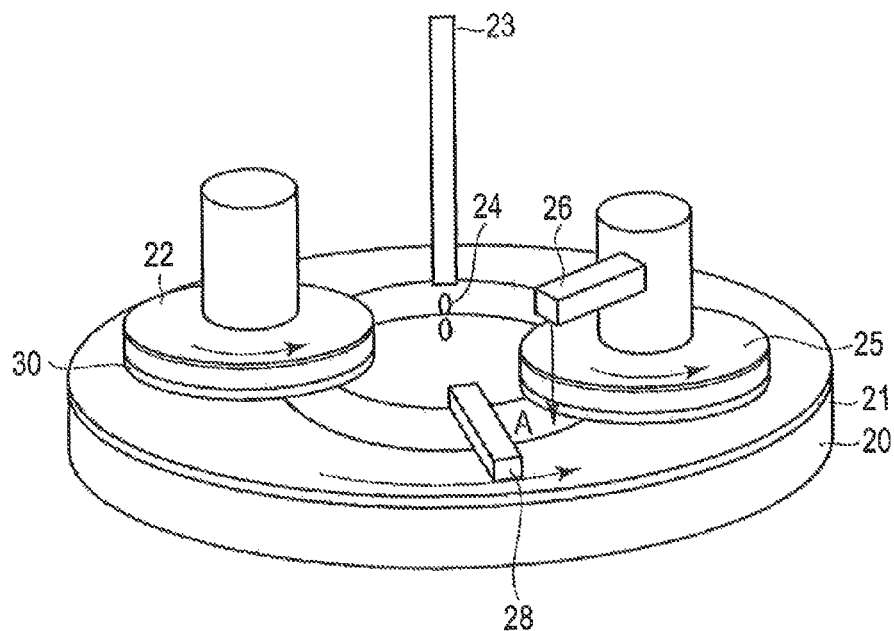
FIG. 15 is a configuration view showing a CMP device in a second CMP method.

FIG. 15 is a configuration view showing the CMP device in the second CMP method.

As shown in FIG. 15, the CMP device in the second CMP method is different from that of the first CMP method in that a heater 28 is provided in place of the vapor supply nozzles 27.

The heater 28 is brought into contact with the surface of the polishing pad 21 during conditioning. The heater 28 is disposed on a radius of the polishing pad 21 about a center of the slurry supply nozzle 23 (rotating shaft of the turntable 20). Accordingly, a rotation of the polishing pad 21 can cause an entire surface thereof to be heated. The heater 28 is disposed upstream in the rotating direction of the turntable 20 to the polishing pad temperature measuring device 26 (the dresser 25). With this configuration, the surface temperature of the polishing pad 21 measured by the polishing pad temperature measuring device 26 can be adjusted during the conditioning by controlling the heater 28. The heater 28 controls the surface temperature of the polishing pad 21 in a range of 23° C. (room temperature) or more to 80° C. or less.

The polishing pad temperature measuring device 26 is disposed upstream in the rotating direction of the turntable 20 to the dresser 25. For this reason, the polishing pad temperature measuring device 26 measures the surface temperature (inlet temperature) of the polishing pad 21 upstream in the rotating direction of the turntable 20 to the dresser 25. Further, the polishing pad temperature measuring device 26 is disposed downstream of the rotating direction of the turntable 20 to the heater 28. That is, the polishing pad temperature measuring device 26 measures the surface temperature of the polishing pad 21 before it comes into contact with the dresser 25 after it has been heated by the heater 28.

[2-2 (2). Flow in Second CMP Method]

A flow in the second CMP method will be explained below using FIG. 11 like the first CMP method.

As shown in FIG. 11, first, at step S21, the polishing pad 21 is conditioned. More specifically, the dresser 25 is brought into contact with the surface of the polishing pad 21, and the dresser 25 and the polishing pad 21 are slid. Further, the surface of the polishing pad 21 is heated by the heater 28.

At this time, the heater 28 is controlled so that the surface temperature of the polishing pad 21 (temperature at the inlet temperature measurement point A measured by the polishing pad temperature measuring device 26) becomes 40° C. or more to 80° C. or less. In this way, the Rsk value of the polishing pad 21 can be made negative.

Next, at step S22, the to-be-processed film 13 is polished. More specifically, the to-be-processed film 13 held by the head 22 is brought into contact with the polishing pad 21 having been conditioned, and the to-be-processed film 13 and the polishing pad 21 are slid.

In this way, the number of scratches on the surface of the to-be-processed film 13 having been polished can be reduced by polishing the surface of the to-be-processed film 13 by bringing the surface of the to-be-processed film 13 into contact with the surface of the rotating polishing pad 21 which has a negative Rsk value.

[2-2 (3). Effect in Second CMP Method]

According to the second CMP method, the surface of the polishing pad 21 is conditioned at a high temperature within the range of 40° C. or more to 80° C. or less by heating the surface of the polishing pad 21 by the heater 28. Thereafter, the to-be-processed film 13 is polished by bringing the surface of the to-be-processed film 13 into contact with the surface of the polishing pad 21 having being conditioned. In this way, the same effect as that of the first CMP can be obtained.

[2-3. Third CMP Method]

Next, a third CMP method will be explained using FIGS. 11, 16, and 17. Note that, in the third CMP method, an explanation of the same points as those of the first CMP method is omitted, and different points will be mainly explained.

[2-3(1). CMP Device in Third CMP Method]

A CMP device in the third CMP method will be explained below using FIGS. 16 and 17.

Figure 16:
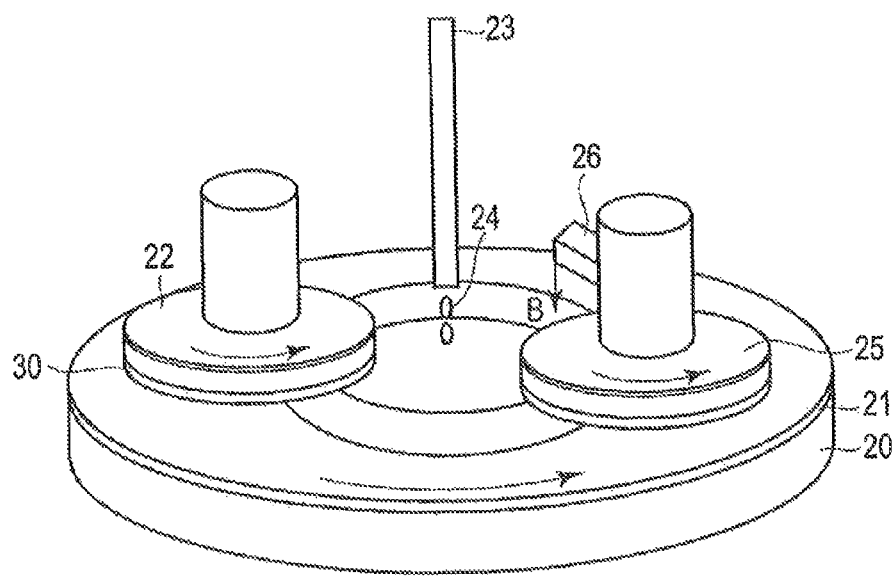
FIG. 16 is a configuration view showing a CMP device in a third CMP method.

FIG. 16 is a configuration view showing the CMP device in the third CMP method. FIG. 17 is an upper surface view showing the CMP device in the third CMP method.

As shown in FIG. 16, the CMP device in the third CMP method is different from that of the first CMP method in that the dresser 25 itself is heated in place of the vapor supply nozzles 27.

The dresser 25 conditions the surface of the polishing pad 21 by being brought into contact with the polishing pad 21. Here, the surface temperature of the polishing pad 21 measured by the polishing pad temperature measuring device 26 can be adjusted during the conditioning by heating and controlling the dresser 25 itself. The dresser 25 controls the surface temperature of the polishing pad 21 within a range of 23° C. (room temperature) or more to 80° C. or less.

As shown in FIG. 17, the polishing pad temperature measuring device 26 is disposed downstream in the rotating direction of the turntable 20 to the dresser 25. Accordingly, the polishing pad temperature measuring device 26 measures the surface temperature (outlet temperature) of the polishing pad 21 downstream in the rotating direction of the turntable 20 to the dresser 25. That is, the polishing pad temperature measuring device 26 measures the surface temperature of the polishing pad 21 having been heated by the dresser 25.

The polishing pad temperature measuring device 26 measures the temperature of the polishing pad 21 on a circular orbit X that passes through a center O' of the dresser 25 and has a predetermined distance about a center O of the turntable 20. Further, to measure the surface temperature of the polishing pad 21 in place of the temperature of a dressing liquid, the polishing pad temperature measuring device 26 preferably measures the temperature at an outlet temperature measurement point B which is positioned on the circular orbit X and away from the dressing liquid by a distance d2 (for example, 10 mm).

[2-3(2). Flow in Third CMP Method]

A flow in the third CMP method will be explained below using FIG. 11 like the first CMP method.

As shown in FIG. 11, first, at step S21, the polishing pad 21 is conditioned. More specifically, the dresser 25 is brought into contact with the surface of the polishing pad 21, and the dresser 25 and the polishing pad 21 are slid. Further, the surface of the polishing pad 21 is heated by heating the dresser 25 itself.

At this time, the dresser 25 is controlled so that the surface temperature of the polishing pad 21 (temperature of the outlet temperature measurement point B measured by the polishing pad temperature measuring device 26) becomes 40° C. or more to 80° C. or less. In this way, the Rsk value of the polishing pad 21 can be made negative.

Next, at step S22, the to-be-processed film 13 is polished. More specifically, the to-be-processed film 13 held by the head 22 is brought into contact with the polishing pad 21 having been conditioned, and the to-be-processed film 13 and the polishing pad 21 are slid.

In this way, the number of scratches on the surface of the to-be-processed film 13 having been polished can be reduced by polishing the surface of the to-be-processed film 13 by bringing the surface of the to-be-processed film 13 into contact with the surface of the rotating polishing pad 21 which has a negative Rsk value.

[2-3 (3). Effect in Third CMP Method]

According to the third CMP method, the surface of the polishing pad 21 is conditioned at a high temperature within the range of 40° C. or more to 80° C. or less by heating the surface of the polishing pad 21 by the dresser 25. Thereafter, the to-be-processed film 13 is polished by being brought into contact with the surface of the polishing pad 21 having being conditioned. In this way, the same effect as that of the first CMP can be obtained.

[2-4. Fourth CMP Method]

Next, a fourth CMP method will be explained using FIGS. 11, 18 to 20. Note that, in the fourth CMP method, an explanation of the same points as those of the first CMP method is omitted, and different points will be mainly explained.

[2-4 (1). CMP Device in Fourth CMP Method]

A CMP device in the fourth CMP method will be explained below.

The CMP device of the fourth CMP method is different from that of the first CMP method in that the surface of the dresser 25 has a positive Rsk value.

The dresser 25 conditions the surface of the polishing pad 21 by being brought into contact with the polishing pad 21. At this time, the surface of the dresser 25 has a positive Rsk value. Note that the surface of the dresser 25 preferably has a positive Rsk value with a larger absolute value. Further, although the dresser 25 is preferably a metal dresser with a coated surface, the dresser 25 is not limited thereto and may be a diamond dresser or a ceramic dresser.

Note that, in the CMP device in the fourth CMP method, it is not necessary to control the surface temperature of the polishing pad 21 during the conditioning. Accordingly, the CMP device of the fourth CMP method need not include the polishing pad temperature measuring device 26 and the vapor supply nozzles 27 in the CMP device in the first CMP method.

[2-4 (2). Flow in Fourth CMP Method]

A flow in the fourth CMP method will be explained using FIGS. 11 and 18 to 20.

Figure 20:
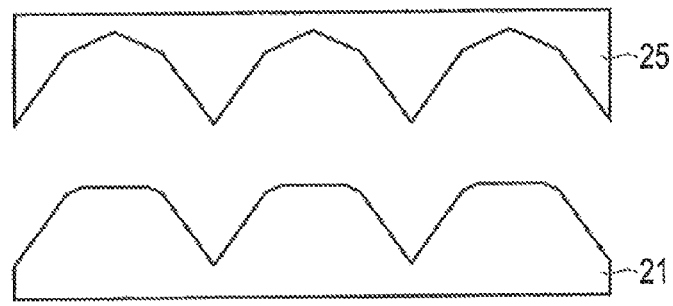

FIGS. 18 to 20 are sectional views showing conditioning steps of the polishing pad 21 in the fourth CMP method.

First, at step S21, the polishing pad 21 is conditioned.

More specifically, first, as shown in FIG. 18, the surface of the dresser 25 is controlled so that the surface of the dresser 25 has a positive Rsk value. Next, as shown in FIG. 19, the surface of the polishing pad 21 is brought into contact with the surface of the dresser 25 having the positive Rsk value. At this time, the dresser 25 is brought into contact with the polishing pad 21 by a dresser load at which a convex portion of the surface of the dresser 25 is pushed into the surface of the polishing pad 21. In this way, a concave portion to which the convex portion of the surface of the dresser 25 is reflected (transferred) is formed on the surface of the polishing pad 21. That is, the Rsk value of the surface of the polishing pad 21 becomes negative. Here, to more reflect the surface shape of the dresser 25 to the surface of the polishing pad 21, it is preferable not to relatively move (for example, not to rotate) the polishing pad 21 and the dresser 25 at the time of conditioning. Next, as shown in FIG. 20, the dresser 25 is separated from the polishing pad 21. Thereafter, the dresser 25 is moved on the polishing pad 21 and the conditioning operation shown in FIGS. 18 to 20 is repeatedly executed.

Note that the conditioning may be executed by bringing the polishing pad 21 into contact with the dresser 25 once by relatively moving (for example, rotating) them without moving the dresser 25.

In this way, the Rsk value of the surface of the polishing pad 21 can be made negative by bringing the surface of the dresser 25 with a positive Rsk value into contact with the surface of the polishing pad 21.

Next, at step S22, the to-be-processed film 13 is polished. More specifically, the to-be-processed film 13 held by the head 22 is brought into contact with the polishing pad 21 having been conditioned, and the to-be-processed film 13 and the polishing pad 21 are slid.

In this way, the number of scratches on the surface of the to-be-processed film 13 having been polished can be reduced by polishing the surface of the to-be-processed film 13 by bringing the surface of the to-be-processed film 13 into contact with the surface of the rotating polishing pad 21 with the Rsk value which has a negative Rsk value.

[2-4 (3). Basis of Conditions in Fourth CMP Method]

Basis of conditions in the fourth CMP method will be explained below.

A conditioning experiment was executed to examine the relation between the Rsk value of the dresser 25 and the Rsk value of the polishing pad 21. The conditioning experiment was executed under the following two conditions (a comparative example and the fourth CMP method).

Comparative Example
  Polishing pad: polyurethane (Shore D hardness 60, elastic modulus 400 MPa)
  Turntable rpm: 20 rpm
  Dresser: diamond roughness 100 (made by Asahi diamond)
  Dresser load: 200 hPa
  Dresser rpm: 20 rpm
  Dressing liquid: pure water at 23° C. (room temperature)

Fourth CMP Method
  Polishing pad: polyurethane (Shore D hardness 60, elastic modulus 400 MPa)
  Turntable rpm: 0 rpm
  Dresser: made of metal with coated surface, surface Rsk>0
  Dresser load: 200 hPa
  Dresser rpm: 0 rpm
  Dressing liquid: pure water at 23° C. (room temperature)

In the comparative example, the Rsk of a surface of a dresser was not controlled (the Rsk of the surface of the dresser is, for example, negative). In contrast, in the fourth CMP method, the Rsk of the surface of the dresser was controlled so that the Rsk became positive. Note that, in each conditioning experiment, the surface temperature of the polishing pad 21 was 23° C. (room temperature).

When the surface of the polishing pad 21 is conditioned by the dresser 25, a negative correlation exists between the Rsk value of the surface of the dresser 25 and the resulting Rsk value of the polishing pad 21 at the time of conditioning. In other words, a larger Rsk value of the surface of the dresser 25 further increases the Rsk value of the polishing pad 21, and vice versa. More specifically, in the respective cases when the Rsk value of the surface of the dresser 25 is negative (comparative example) and when it is positive (fourth CMP method), the Rsk values of the polishing pads 21 are 0.32 and −0.18.

As describe above, it is preferable to make the Rsk value of the surface of the polishing pad 21 negative with a larger absolute value by the conditioning. The Rsk value of the surface of the polishing pad 21 can be made negative with a larger absolute value by making the Rsk value of the surface of the dresser 25 in the conditioning positive with a larger absolute value.

[2-4 (4). Effect in Fourth CMP Method]

According to the fourth CMP method, the surface of the polishing pad 21 is conditioned by controlling the Rsk value of the surface of the dresser 25. Thereafter, the to-be-processed film 13 is polished by bringing the surface of the to-be-processed film 13 into contact with the surface of the polishing pad 21 having been conditioned. In this way, the following effect can be obtained.

The Rsk value of the surface of the polishing pad 21 can be made a negative value by executing the conditioning by making the Rsk value of the surface of the dresser 25 a positive value. The number of scratches on the surface of the to-be-processed film 13 can be reduced after the CMP process by polishing the to-be-processed film 13 by bringing the surface of the to-be-processed film 13 into contact with the surface of the polishing pad 21 that has a negative Rsk value. As a result, a reduction in yield and reliability of the device can be suppressed.

[3. Second Planarization Method]

A second planarization method according to the embodiment will be explained below using FIGS. 21 to 27. The second planarization method is a chemical polishing method of removing a surface layer 32 on a convex portion 31a of the to-be-processed film 13 in a processing solution 33 after the surface layer 32 has been formed on the surface of the to-be-processed film 13 having an irregularity 31 (a concave portion 31b and the convex portion 31a) to thereby dissolve the convex portion 31a having being exposed by the processing solution 33. In this way, the number of scratches on the surface of the to-be-processed film 13 can be reduced after the chemical polishing. First and second chemical polishing methods will be explained below as the second planarization method.

[3-1. First Chemical Polishing Method]

First, the first chemical polishing method will be explained using FIGS. 21 to 24.

[3-1 (1). Flow in First Chemical Polishing Method]

A flow in the first chemical polishing method will be explained below using FIGS. 21 and 22.

Figure 21:
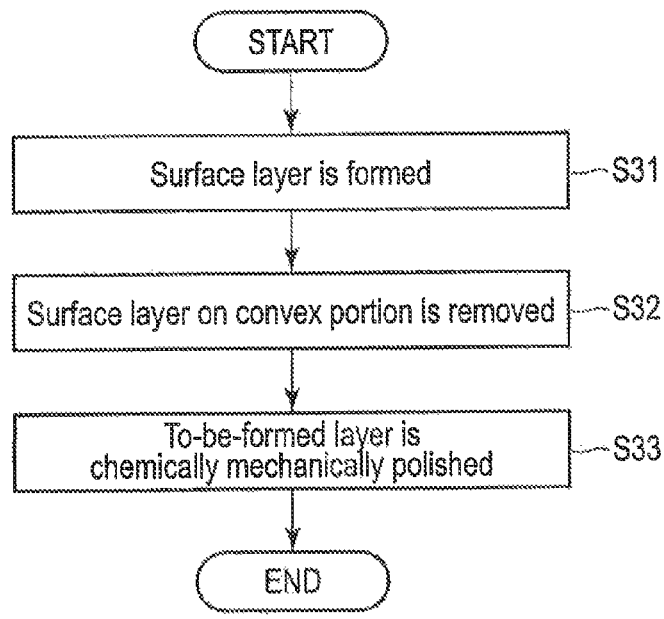
FIG. 21 shows a flowchart in a first chemical polishing method.

FIG. 21 is a flowchart of the first chemical polishing method.

FIGS. 22A to 22D are sectional views showing flows in the first chemical polishing method and are sectional views showing the to-be-processed film 13 having the irregularity 31.

Figure 22A:
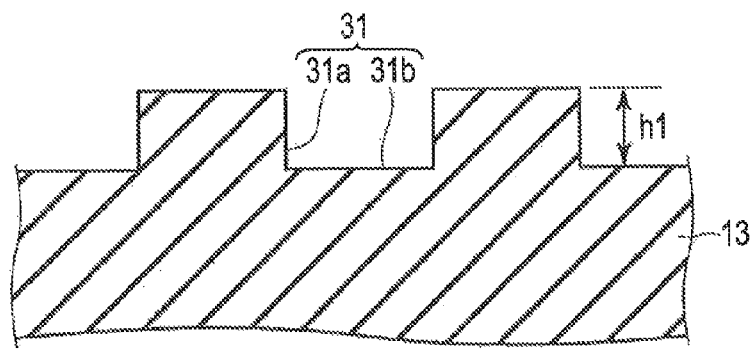

As shown in FIG. 22A, the to-be-processed film 13 has the irregularity 31 on its surface. The irregularity 31 has the convex portion 31a and the concave portion 31b. The distance between a surface of the convex portion 31a and a surface of the concave portion 31b (a depth h1 of the irregularity 31) is, for example, about 30 nm or more to 5,000 nm or less.

First, in the first chemical polishing method, as shown in FIGS. 21 and 22B, at step S31, the surface layer 32 is formed on the to-be-processed film 13 having the irregularity 31. A surface layer 32 covers the surface of the to-be-processed file 13 and formed along the irregularity 31 of the to-be-processed film 13. The surface layer 32 is formed by a bond with or adsorption such as chemical adsorption, and the like to the to-be-processed film 13. The surface layer 32 suppresses the to-be-processed film 13 from being dissolved by a processing solution 33 to be described later. That is, the surface layer 32 acts as a protection layer of the to-be-processed film 13.

As the surface layer 32, for example, at least one of a surfactant layer, a self-assembled monolayer, and a water repellent layer is used. Examples of the surface layer 32 will be described later.

Next, as shown in FIGS. 21 and 22C, at step S32, the surface layer 32 on the convex portion 31a of the to-be-processed film 13 is removed. More specifically, at least one of the to-be-processed film 13 and a processing body 34 is rotated while bringing the to-be-processed film 13 into contact with the processing body 34 via the surface layer 32 in the processing solution 33. That is, the to-be-processed film 13 and the processing body 34 are slid so that a relative position between the to-be-processed film 13 and the processing body 34 changes. The rotation is executed using a direction vertical to, for example, a plane on which the to-be-processed film 13 is in contact with processing body 34 as an axis of rotation.

Further, the processing body 34 is polishing pads 61, 81 to be described later. The processing body 34 contains, for example, a resin material. Further, the processing body 34 can contain, for example, a catalyst material.

With this configuration, the surface layer 32 on the convex portion 31a in contact with the processing body 34 is removed while leaving the surface layer 32 on the concave portion 31b which is not in contact with the processing body 34. In other words, the surface layer 32 on the convex portion 31a of the irregularity 31 is removed selectively. Accordingly, a state can be obtained in which the concave portion 31b is covered with the surface layer 32 and an upper surface of the convex portion 31a is exposed from the surface layer 32.

Further, the processing solution 33 is a solution for dissolving the to-be-processed film 13. When, for example, the to-be-processed film 13 is made of $SiO_2$, the processing solution 33 can contain a hydrogen fluoride solution, an ammonium fluoride solution, or a strong alkaline solution.

For this reason, the exposed convex portion 31a is dissolved by the processing solution 33 by being brought into contact with the processing solution 33 while in contact with the processing body 34. In contrast, since the concave portion 31b is covered with the surface layer 32 and is not in contact with processing solution 30, the concave portion 31b is unlikely to be dissolved. That is, the dissolution degree of the convex portion 31a of the to-be-processed film 13 becomes larger than that of the concave portion 31b.

When dissolution of the to-be-processed film 13 is advanced in this state, as shown in FIGS. 21 and 22D, at step S33, the to-be-processed film 13 is chemically polished. That is, the depth h2 of the irregularity of the to-be-processed film 13 after the chemical polishing (step S33 in FIG. 21) becomes smaller than the depth h1 of the irregularity before the processing. In this way, after the chemical polishing, a state can be obtained in which the depth (dimension) of the irregularity after the processing is smaller than the initial depth (dimension) of the irregularity.

[3-1(2). Effect in First Chemical Polishing Method]

According to the first chemical polishing method, after the surface layer 32 has been formed on the surface of the to-be-processed film 13 having the irregularity 31 (the concave portion 31b and the convex portion 31a), the surface layer 32 on the convex portion 31a of the to-be-processed film 13 is brought into contact with the processing body 34 in the processing solution 33 to thereby remove the surface layer 32 on the convex portion 31a. Then, the chemical polishing is executed by dissolving the exposed convex portion 31a by the processing solution 33 while bringing the exposed convex portion 31a into contact with the processing body 34. The processing solution 33 does not substantially contain abrasive grains. As a result, the number of scratches on the surface of the to-be-processed film 13 can be reduced after the chemical polishing.

[3-1(3). Examples According to First Chemical Polishing Method]

According to the first chemical polishing method, there can be provided an efficient chemical polishing method by which the generation of scratches is suppressed. Examples according to the first chemical polishing method will be explained below.

First Example

FIGS. 23A to 23D are sectional views showing flows in a first example according to the first chemical polishing method and are sectional views showing a to-be-processed film 13 having an irregularity 31.

As shown in FIG. 23A, the to-be-processed film 13 has the irregularity 31 on its surface. The irregularity 31 has a convex portion 31a and a concave portion 31b. The distance between a surface of the convex portion 31a and a surface of the concave portion 31b (the depth h1 of the irregularity 31) is, for example, about 30 nm or more to 5000 nm or less.

As shown in FIG. 23B, a surfactant adsorbs onto the to-be-processed film 13 as a surface layer 32. The surfactant (surface layer 32) adsorbed onto the surface of the to-be-processed film 13 acts as a surface protection film. As the surfactant, an anionic surfactant, a cationic surfactant, an amphoteric surfactant and a non-ionic surfactant can be used. Furthermore, the surfactant can be selected among surfactants of an anionic surfactant, an anionic surfactant with a non-ionic part, a cationic surfactant, an amphoteric-based surfactant and a non-ionic-based surfactant. As a functional group preferably used for the surfactant, for example, functional groups of, such as, a carboxylic acid type, sulfonic acid type, sulfate ester type, phosphate ester type, amine salt type, quarternary ammonium salt type, ether type, ester type, alkanolamide type, carboxybetaine type, and glycine type are exemplified.

For example, the surfactant can have a polarity opposite to the polarity of the to-be-processed film 13. Because of this, the surfactant can more strongly adsorb onto the to-be-processed film 13 by an electric interaction. As a result, the surface layer 32 can be stably formed. When, for example, the to-be-processed film 13 is made of $SiO_2$, it is preferable to use a cationic surfactant as a surfactant acting as the surface layer 32.

Because of this, the surfactant more strongly adsorbs onto the to-be-processed film 13 made of $SiO_2$ by an electric interaction. As described above, when the surfactant is used as the surface layer 32, the surface layer 32 chemically adsorbs onto the to-be-processed film 13. That is, in the first chemical polishing method, formation of the surface layer 32 includes to form a layer of a surfactant on the to-be-processed film 13.

As shown in FIG. 23C, the to-be-processed film 13 and a processing body 34 are rotated while bringing the to-be-processed film 13 into contact with the processing body 34 via the surface layer 32 in a processing solution 33. As the processing solution 33, for example, a solution of potassium hydroxide, ammonia, and the like is used. The processing solution 33 has a pH of about 10, and the processing solution 33 is a strong alkaline solution. In the processing solution 33, the chemical polishing is executed by bringing the processing body 34 into contact with the to-be-processed film 13 ($SiO_2$) while rotating at least one of the to-be-processed film 13 and the processing body 34. As the processing body 34, a polishing pad made of, for example, a urethane resin is used.

Figure 23D:
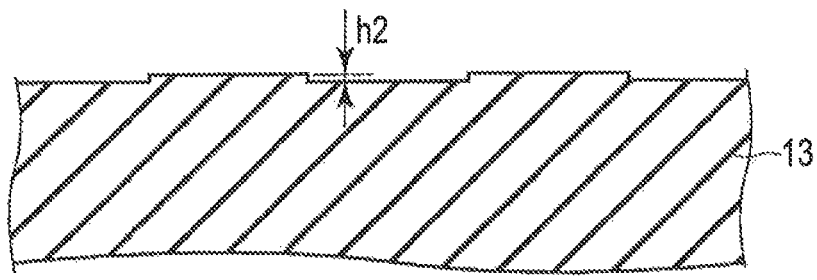

At this time, as shown in FIG. 23C, the concave portion 31b of the to-be-processed film 13 is protected by a surface layer 32 made of the surfactant, and thus dissolution of the concave portion 31b is suppressed even in the strong alkaline solution. In contrast, as to the convex portion 31a, the surfactant secedes from the upper surface of the convex portion 31a and the $SiO_2$ film of the convex portion 31a is exposed due to contact between the urethane resin and the processing body 34. On the surface of the to-be-processed film 13, if the adsorbed amount of the surfactant is large, the dissolution rate of the to-be-processed film 13 by the processing solution 33 will be low. For this reason, in the convex portion 31a, dissolution is advanced by the strong alkaline solution. In this way, convex portions 31a are selectively dissolved and planarization is chemically advanced. As a result, as shown in FIG. 23D, the depth h2 of the irregularity of the to-be-processed film 13 after the chemical polishing becomes smaller than the depth h1 of the irregularity before the processing.

In the first example, a processing selection ratio of the convex portion 31a to the concave portion 31b is high. For this reason, a high flatness can be obtained efficiently. In addition, since no abrasive grain is used, the generation of scratches is suppressed.

Second Example

In a second example, as a surface layer 32, polyvinyl pyrrolidone (PVP) that is a cationic surfactant is formed on the surface of the to-be-processed film 13 made of $SiO_2$ (refer to FIG. 23C). In the second example, since the cationic surfactant is used, the surface layer 32 easily adsorbs onto the to-be-processed film 13 made of $SiO_2$ the surface charge of which is negative, and thus the surface layer 32 can be formed easily. In addition to the above mentioned, as a cationic surfactant, polyethyleneimine (PEI) can also be used.

The weight average molecular weight (Mw) in terms of polyethylene glycol of PVP used in the second example, measured by water-based GPC (gel permeation chromatography) is 20,000 or more, preferably, 200,000 or more to 1,500,000 or less, and more preferably, 300,000 or more to 1,500,000 or less. If the weight average molecular weight is within the above ranges, friction due to contact with a processing body 34 made of a urethane resin can be reduced. When a surfactant is used, the protection effect is higher as the weight average molecular weight becomes larger.

Alternatively, for example, it is possible to mix a first PVP having a weight average molecular weight of 200,000 or more and a second PVP having a weight average molecular weight of 20,000 or less. In this way, protection from a processing solution 33 can be executed by the first PVP having a relatively larger molecular weight, and a to-be-processed film 13 can be densely covered with a surface layer 32 by the second PVP having a relatively smaller molecular weight.

The weight average molecular weight (Mw) of PEI in terms of polyethylene glycol, measured by water-based GPC is 10,000 or more, preferably, 100,000 or more to 1,000,000 or less. If the weight average molecular weight is within the above ranges, friction due to contact with the processing body 34 made of a urethane resin can be reduced.

Furthermore, as shown in FIG. 23C, the concave portion 31b of the to-be-processed film 13 is protected by the surface layer 32 made of a cationic surfactant, and thus its dissolution by a processing solution 33 is suppressed. In contrast, as to a convex portion 31a, by contact with the processing body 34 made of a urethane resin, the cationic surfactant is seceded from the upper surface of the convex portion 31a, and thus $SiO_2$ of the convex portion 31a is exposed. If the adsorbed amount of the surfactant on the surface of the to-be-processed film 13 is large, the dissolution rate of the to-be-processed film 13 by the processing solution 33 is low. For this reason, dissolution of the convex portion 31a is advanced by a mixed solution of hydrogen fluoride and ammonium fluoride. In this way, convex portions 31a are dissolved selectively, and planarization is advanced chemically.

Third Example

In a third example, two types of surfactants are used to form a surface layer 32. A cationic surfactant is used as a first surfactant and an anionic surfactant is used as a second surfactant to thereby form a surface layer on a to-be-processed film 13 (refer to FIG. 23C). Due to the electric or hydrophobic interaction, mixing the cationic surfactant and the anionic surfactant produces a stronger protection effect of the surface layer 32 than in a case that no anionic surfactant is used.

The first cationic surfactant used in the third example is, for example, polyvinyl pyrrolidone (PVP) or polyethyleneimine (PEI). As the second anionic surfactant, for example, polyacrylic acid (PAA) can be used.

As the weight average molecular weight of PAA used in the third example, for example, the weight average molecular weight (Mw) in terms of polyethylene glycol measured by GFC can be applied. Although it is sufficient if the weight average molecular weight (Mw) of PAA is 2,000 or more to 5,000,000, it is preferably 4,000 or more to 100,000 or less. Since the second surfactant is an anionic surfactant, even if it is used alone, the dissolution suppression effect is small.

To further suppress dissolution, although the protection effect is higher as the weight average molecular weight of the first surfactant is larger, the second surfactant preferably has a relatively small weight average molecular weight. When, for example, the first PEI having a weight average molecular weight of 1,000,000 is mixed with the second PAA having a weight average molecular weight of 4,000, the to-be-processed film 13 can be more densely covered and thus friction and dissolution can be more suppressed.

As shown in FIG. 23C, a concave portion 31b of the to-be-processed film 13 is protected by the surface layer 32 containing the first surfactant having the cationic property and the second surfactant having the anionic property and thus its dissolution by a processing solution 33 is suppressed. In contrast, as to a convex portion 31a, by contact with a processing body 34 made of a urethane resin, the first cationic surfactant and the second cationic surfactant are seceded from the convex portion 31a, and thus $SiO_2$ of the convex portion 31a is exposed. If the adsorbed amount of the surfactant on the surface of the to-be-processed film 13 is large, the dissolution rate of the to-be-processed film 13 by the processing solution 33 is low. For this reason, dissolution of the convex portion 31a is advanced in the convex portion 31a by a mixed solution of hydrogen fluoride and ammonium fluoride. In this way, the convex portion 31a is selectively dissolved and planarization is chemically advanced.

Fourth Example

In a fourth example, a self-assembled monolayer (SAM) is formed on a surface of a to-be-processed film 13 made of $SiO_2$ as a surface layer 32. In this way, the formation of the surface layer 32 can include forming a self-assembled monolayer on the to-be-processed film 13.

Self-assembling molecules adsorb in a direction in which reactive functional groups are directed to the surface of the $SiO_2$ film. For example, when the self-assembling molecules have long-chain alkyl groups, a van der Waals force and an interaction between hydrophobic groups operate. For example, when the self-assembling molecules have a benzene ring, a π electron interaction acts. Such molecules are thermally stabilized when adsorbed molecules are assembled, and thus a monolayer in which molecules are densely integrated is formed.

By using the self-assembled monolayer as the surface layer 32, wet etching of the to-be-processed film 13 by a processing solution 33 is suppressed. The surface layer 32 with the self-assembled monolayer covers the to-be-processed film 13 more densely than in the case in which a surfactant is used. For this reason, the effect of protecting the to-be-processed film 13 from the processing solution 33 is large.

As a method for forming a self-assembled monolayer on the surface of the $SiO_2$ film, for example, a silane coupling reaction can be used. For example, when the surface of the $SiO_2$ film is processed by organic silane, the silane coupling reaction by which organic silane molecules are fixed by covalent bonding occurs. At this time, the surface of the $SiO_2$ film is modified by a siloxane bond (Si—O—Si). That is, the surface layer 32 binds to the to-be-processed film 13. In this way, formation of the surface layer 32 can include generating the silane coupling reaction.

In the fourth example, as the processing solution 33, a hydrogen fluoride solution is used, and as a processing body 34, a plate of Pt (platinum) is used. The Pt plate acts as a catalyst. Chemical polishing is executed in the hydrogen fluoride solution, by rotating at least one of the $SiO_2$ film (to-be-processed film 13) and the Pt plate (processing body 34) while bringing them into contact with each other via the surface layer 32. At this time, at the concave portion 31b of the $SiO_2$ film, dissolution by the hydrogen fluoride solution is suppressed by modification/protection of the surface layer 32 made of the self-assembled monolayer.

In contrast, near the Pt plate (catalyst) of a convex Portion 31a, by a reaction according to the following formula (1), a hydroxyl radical (OH*) is generated.

$$F^* + H_2O \rightarrow OH^* + HF \tag{1}$$

Figure 24:
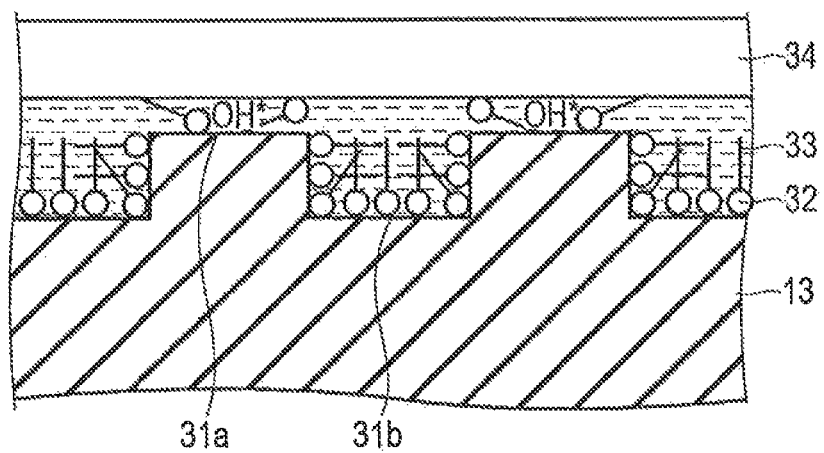
FIG. 24 is a sectional view showing a fourth embodiment according to the first chemical polishing method.

FIG. 24 is a sectional view showing the fourth example according to the first chemical polishing method.

FIG. 24 schematically illustrates a state of generation of the hydroxyl radical (OH*) near the Pt plate (catalyst) of the convex portion 31a. At the convex portion 31a in contact with the catalyst of the Pt plate (processing body 34), the siloxane bond is broken by oxidation due to the hydroxyl radical, and $SiO_2$ is formed. Then $SiO_2$ is dissolved by the following formula (2).

$$SiO_2 + 6HF \rightarrow H_2SiF_6 + 2H_2O \tag{2}$$

As a result, convex portions 31a are dissolved selectively, and planarization is advanced chemically. When the amount of the self-assembled monolayer is large on the to-be-processed film 13, the dissolution rate of the to-be-processed film 13 by the processing solution 33 is low.

In the fourth example, the processing selection ratio of a convex portion 31a to the concave portion 31b is high. For this reason, a high flatness can be obtained efficiently. In addition to this, since no abrasive grains are used, generation of scratches is suppressed.

Fifth Example

In a fifth example, a self-assembled monolayer is used as a surface layer 32, and $TiO_2$ is used as a processing body 34. $TiO_2$ acts as a photocatalyst.

For example, in a strong alkaline solution having a pH of about 10, chemical polishing is executed by bringing the $SiO_2$ film into contact with a $TiO_2$ plate via the surface layer 32 made of the self-assembled monolayer and rotating at least one of them. At the time, a surface of the TiO$_2$ plate is irradiated with light containing UV light. At a concave portion 31b of the SiO$_2$ film, dissolution by the strong alkaline solution is suppressed by modification/protection by the surface layer 32 made of the self-assembled monolayer.

In contrast, near the TiO$_2$ plate (catalyst) of a convex portion 31a, a hole is formed by the photocatalyst effect of TiO$_2$ and a hydroxyl radical is generated by the following formulas (3) and (4).

$$TiO_2 + h\nu \rightarrow e^- + h^+ \quad (3)$$

$$OH^- + h^+ \rightarrow OH^* \quad (4)$$

At the convex portion 31a in contact with the catalyst, a siloxane bond is broken by oxidation caused by hydroxyl radicals and SiO$_2$ is formed on a surface of the convex portion 31a. Then, the SiO$_2$ film is dissolved by a processing solution 33 that is a strong alkaline solution. As a result, convex portions 31a are dissolved selectively, and planarization is advanced chemically.

In the fifth example, since the processing selection ratio of the convex portion 31a to the concave portion 31b is also high, a high flatness can be achieved efficiently. In addition, since no abrasive grains are used, generation of scratches is suppressed. The self-assembled monolayer used as the surface layer 32 can be removed after the chemical processing by means of, for example, ashing.

Six Example

In a sixth example, a water-repellent processed layer is used as a surface layer 32. For example, as a treatment of forming the surface layer 32, for example, silylation processing by tetramethyl silyldiethylamine (TMSDMA) is executed. Then, an Mo (molybdenum) plate is used as a processing body 34. The Mo plate acts as a catalyst. A hydrogen fluoride solution is used as a processing solution 33.

In the hydrogen fluoride solution, via the surface layer 32 that is the water-repellent processed layer, chemical polishing is executed by bringing the SiO$_2$ film into contact with the Mo plate and rotating at least one of them. At this time, at a concave portion 31b of the SiO$_2$ film, dissolution by hydrogen fluoride is suppressed by the surface layer 32 of the water-repellent processed layer. On the surface of the to-be-processed film 13, when the amount of the water repellent processed layer is large (when the degree of water repellency of the SiO$_2$ film is high), the dissolution rate of the to-be-processed film 13 by the processing solution 33 is low.

A hydroxyl radical is generated by the reaction of formula (1) near the Mo plate of the convex portion 31a. At a convex portion 31a in contact with the Mo plate that is a catalyst, a siloxane bond is broken by oxidization caused by hydroxyl radicals and SiO$_2$ is formed on the surface of the convex portion 31a. SiO$_2$ is dissolved by the reaction of formula (2). As a result, convex portions 31a are selectively dissolved and planarization is chemically advanced.

In the sixth example, since the processing selection ratio of the convex portion 31a to the concave portion 31b is also high, a high flatness can be achieved efficiently. In addition, since no abrasive grains are used, generation of scratches is suppressed.

Seventh Example

In a seventh example, a water-repellent treated layer using hexamethyl disilazane (HMDS) is used as a surface layer 32.

In addition, a Pt plate is used as a processing body 34, and a hydrogen fluoride solution is used as a processing solution 33.

In this case, near the Pt plate of the convex portion 31a, hydroxyl radicals are also generated by the reaction of formula (1), and convex portions 31a are dissolved selectively, and planarization is advanced chemically. In the seventh embodiment, since the processing selection ratio of a convex portion 31a to a concave portion 31b is also high, a high flatness can be obtained efficiently. In addition, since no abrasive grains are used, the generation of scratches is suppressed.

In this way, formation of the surface layer 32 can include subjecting a to-be-processed film 13 to water repellent processing. Subjecting the to-be-processed film 13 to water repellent processing can include performing processing using at least one of tetramethyl silyldiethylamine and hexamethyl disilazane.

A catalyst material used for the processing body 34 can contain at least one of Pt and Mo. In addition, the catalyst material contains TiO$_2$, and a planarization process can include irradiating the to-be-processed film 13 with UV light.

[3-2. Second Chemical Polishing Method]

First, the second chemical polishing method will be explained using FIGS. 25 to 27. In the second chemical polishing method, a processing solution 33 contains a material for forming a surface layer 32. The forming the surface layer 32 includes bringing a processing solution 30 containing the material for forming the surface layer 32 into contact with a to-be-processed film 13 and forming the surface layer 32 of the material. The second chemical polishing method will be explained below in detail.

[3-2(1). Flow in Second Chemical Polishing Method]

A flow in the second chemical polishing method will be explained below using FIGS. 25A to 25D.

FIGS. 25A to 25D are sectional views showing flows in the second chemical polishing method and sectional views showing the to-be-processed film 13 having an irregularity 31.

Figure 25A:
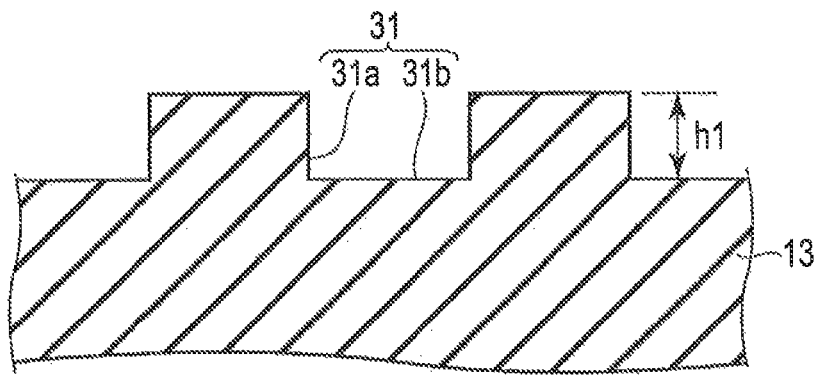

As shown in FIG. 25A, the to-be-processed film 13 has the irregularity 31 on its surface. The irregularity 31 has a convex portion 31a and a concave portion 31b. The distance between a surface of the convex portion 31a and a surface of the concave portion 31b (the depth h1 of the irregularity 31) is, for example, about 30 nm or more to 5,000 nm.

First, in the second chemical polishing method, as shown in FIG. 25B, for example, a processing solution 33 which contains a surfactant (material of the surface layer 32) for forming a surface layer 32 is brought into contact the to-be-processed film 13. The surfactant of the processing solution 33 adsorbs onto a surface of the to-be-processed film 13, and the surface layer 32 is formed.

Next, as shown in FIG. 25C, the surface layer 32 on the convex portion 31a of the to-be-processed film 13 is removed. More specifically, at least one of the to-be-processed film 13 and a processing body 34 is rotated while bringing the to-be-processed film 13 into contact with the processing body 34 via the surface layer 32 in the processing solution 33. In this way, the surface layer 32 on the convex portion 31a in contact with the processing body 34 is removed while leaving the surface layer 32 on the concave portion 31b which is not in contact with the processing body 34. The exposed convex portion 31a is dissolved by the processing solution 33 by being brought into contact with the processing solution 33 while in contact with the processing body 34. In contrast, since the concave portion 31b is covered with the surface layer 32 and is not in contact with the processing solution 33, the concave portion 31b is unlikely to be dissolved.

In this state, when dissolution of the to-be-processed film 13 is advanced, as shown in FIG. 25D, the to-be-processed film 13 is chemically polished. That, is, the depth h2 of the irregularity of the to-be-processed film 13 after the chemical polishing becomes smaller than the depth h1 of the irregularity before the processing. In this way, after the chemical polishing, a state can be obtained in which the initial depth (dimension) of the irregularity is smaller than the depth (dimension) of the irregularity after the processing.

[3-2(2). Effect in Second Chemical Polishing Method]

According to the second chemical polishing method, the processing solution 33 is brought into contact with the surface of the to-be-processed film 13 having the irregularity 31 (concave portion 31b and convex portion 31a). The processing solution 33 contains a component for forming the surface layer 32 and a component for dissolving the to-be-processed film 13. For this reason, the surface layer 32 is forced by bringing the processing solution 33 into contact with the surface of the to-be-processed film 13. Thereafter, the surface layer 32 on the convex portion 31 of the to-be-processed film 13 is brought into contact with the processing body 34 in the processing solution 33 to thereby remove the surface layer 32 on the convex portion 31. Then, the chemical polishing is executed by dissolving the exposed convex portion 31a by the processing solution 33 while bringing the exposed convex portion 31a into contact with the processing body 34. In this way, the same effect as that of the first chemical polishing method can be obtained. Further, in the second chemical polishing method, since the surface layer 32 is formed of the material in the processing solution 33, a step for forming the surface layer 32 can be simplified. ps [3-3. Chemical Polishing Device in Second Planarization Method]

A chemical polishing device in the second planarization method will be explained below using FIGS. 26 and 27.

Figure 26:
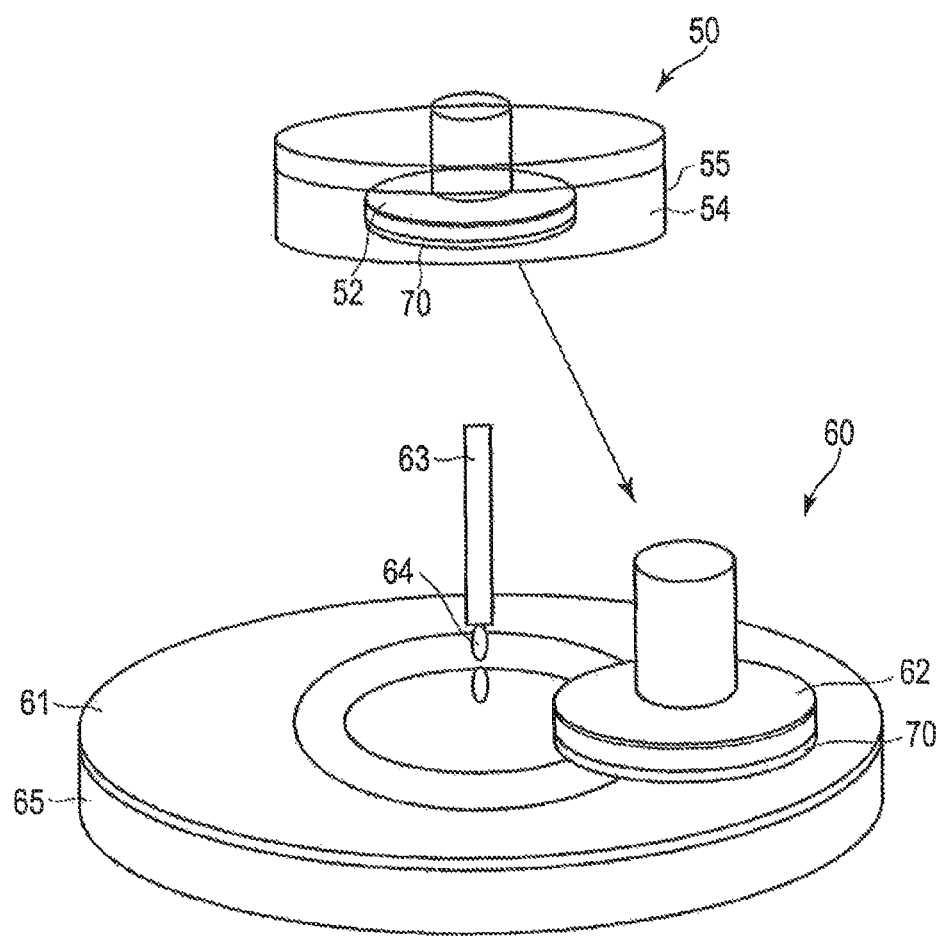
FIG. 26 is a configuration view showing an example of a chemical polishing device in a second planarization method.

FIG. 26 is a configuration view showing an example of the chemical polishing device in the second planarization method.

As shown in FIG. 26, the chemical polishing device according to the example includes a preprocessing unit 50 and a polishing processing unit 60.

The preprocessing unit 50 includes a vessel 55 and a head 52. The head 52 holds a wafer 70 (a semiconductor substrate 10). A preprocessing solution 54 can be stored in the vessel 55. The wafer 70 is brought into contact with the preprocessing solution 54. In this way, preprocessing is executed.

The polishing processing unit 60 includes a polishing pad 61 attached on a turntable 65, a head 62, and a liquid medicine supply nozzle 63. The head 62 holds the wafer 70. A liquid medicine 64 is supplied from the liquid medicine supply nozzle 63 toward the polishing pad 61. The polishing pad 61 confronts the wafer 70 via the liquid medicine 64. The wafer 70 is rotated while rotating the polishing pad 61. In this way, a polishing process is executed.

In the example of the chemical polishing device in the second planarization method, a step of forming a surface layer 32, which bonds or adsorbs on a to-be-processed film 13 along an irregularity 31 and suppresses dissolution of the to-be-processed film 13 can be executed. Further, the device can execute a step of rotating the to-be-processed film 13 and a processing body 34 while bringing the to-be-processed film 13 into contact with the processing body 34 via the surface layer 32 in a processing solution 33, removing the surface layer 32 on a convex portion 31a of the irregularity 31 while leaving the surface layer 32 on a concave portion 31b of the irregularity 31, and planarizing the to-be-processed film 13 by making the dissolution degree of the convex portion 31a larger than that of the concave portion 31b.

Note that the process for forming the surface layer 32 can be executed by the preprocessing unit 50. A step for planarizing the to-be-processed film 13 can be executed by the polishing processing unit 60.

Figure 27:
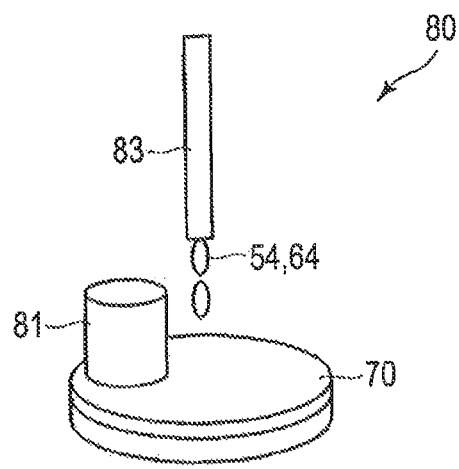
FIG. 27 is a configuration view showing another example of the chemical polishing device in the second planarization method.

FIG. 27 is a configuration view showing another example of the chemical polishing device in the second planarization method.

As shown in FIG. 27, the chemical polishing device according to the other example includes a preprocess polishing processing unit 80.

The preprocess polishing processing unit 80 includes a pad 81 and a nozzle 83. The nozzle 83 switches the liquid medicine 64 or the preprocessing solution 54 and supplies it onto the wafer 70. The chemical polishing device according to the other example can also execute a step of forming the surface layer 32 and a step of planarizing a to-be-processed film 13.

Note that the step of forming the surface layer 32 and the step of planarizing the to-be-processed film 13 can be executed by the preprocess polishing processing unit 80.

[4. Effect of Manufacturing Method of Semiconductor Device According to Embodiment]

In a comparative example 1, a film planarization/thickness reduction process of a to-be-processed film 13 with an irregularity formed on an air gap 14 or a porous layer 15 is executed by an ordinary CMP method. In this case, scratches are generated on a surface of the to-be-processed film 13 by abrasive grains included in a slurry 24 or a stress concentration resulting from a surface of a polishing pad 21. Cracks are generated to the air gap 14 or a porous layer 15 portion whose mechanical strength has been reduced by a shearing stress caused by bringing the polishing pad 21 into contact with the to-be-processed film 13. Further, cracks nay be generated to the air gap 14 or the porous layer 15 portion by the scratches generated to the surface of the to-be-processed film 13.

In a comparative example 2, a film planarization/thickness reduction process of a to-be-processed film 13 with an irregularity formed on an air gap 14 or a porous layer 15 is executed by a CMP method employing the first planarization method (first to fourth CMP methods). That is, a CMP method using a polishing pad 21 whose surface has a negative Rsk value is executed. In this case, scratches generated on a surface of the to-be-processed film 13 can be reduced. However, when the thickness of the to-be-processed film 13 is reduced by a shearing stress caused by bringing the polishing pad 21 into contact with the to-be-processed film 13, cracks are generated to the air gap 14 or the porous layer 15 portion whose mechanical strength has been reduced.

In a comparative example 3, a film planarization/thickness reduction process of a to-be-processed film 13 with an irregularity formed on an air gap 14 or a porous layer 15 is executed by a chemical polishing method employing the second planarization method. That is, a chemical polishing method for bringing a processing body 34 (pads 61, 81) into contact with a to-be-processed film 13 in a processing solution 33 is executed. In the case, since a slurry containing abrasive grains is not used, scratches generated on the surface of the to-be-processed film 13 can be reduced. However, when the thickness of the to-be-processed film 13 is reduced by a shearing stress caused by bringing the processing body 34 (pads 61, 81) into contact with the to-be-processed film 13, cracks are generated to the air gap 14 or a portion of the porous layer 15 whose mechanical strength is reduced.

In contrast, according to the manufacturing method of the semiconductor device of the embodiments, in the film planarization/thickness reduction process of the to-be-processed film 13 with the irregularity formed on the air gap 14 or the porous layer 15, the to-be-processed film 13 is planarized by the predetermined planarization method (first planarization method or the second planarization method) capable of reducing generation of scratches on the surface of the to-be-processed film 13. Thereafter, in a state that the to-be-processed film 13 has a desired thickness (for example, about 480 nm), the planarization method is switched to the etching back so as to reduce the thickness of the to-be-processed film 13 by the etching back. In this way, the following effect can be obtained.

Scratches generated on the surface of the to-be-processed film 13 can be reduced by executing the predetermined planarization method. With this operation, cracks can be prevented from being generated on the air gap 14 or the porous layer 15 by the scratches.

Further, a processing method is switched from the predetermined planarization method to the etching back in a state that the to-be-processed film 13 has a sufficient thickness. In other words, the predetermined planarization method by which a shearing stress is generated is executed when the to-be-processed film 13 has a sufficient thickness on the air gap 14 or the porous layer 15. The process (thickness reduction) executed thereafter is executed by the etching back that is a non-contact process by which no shearing stress is generated. In this way, a shearing stress applied to the air gap 14 or the porous layer 15 portion can be reduced when the predetermined planarization method is executed. That is, the cracks generated to the air gap 14 or the porous layer 15 portion by the shearing stress at the time of the predetermined planarization method can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device comprising:
    forming a to-be-processed film comprising a convex potion and concave potion on its surface on a semiconductor substrate via layer having a relative dielectric constant smaller than that of $SiO_2$;
    planarizing the surface of the to-be-processed film; and
    etching the planarized surface of the to-be-processed film.

2. The method of claim 1, wherein the planarizing the surface of the to-be-processed film comprises chemically mechanically polishing the to-be-processed film by sliding the to-be-processed film and a polishing pad with a negative Rsk value while bringing the surface of the to-be-processed film into contact with a surface of the polishing pad.

3. The method of claim 2, wherein the planarizing the surface of the to-be-processed film further comprises conditioning the polishing pad by making the surface temperature of the polishing pad 40° C. or more while bringing a dresser into contact with the surface of the polishing pad.

4. The method of claim 3, wherein in the conditioning the polishing pad, the surface temperature of the polishing pad is 80° C. or less.

5. The method of claim 3, wherein the surface temperature of the polishing pad is adjusted by supplying a water vapor to the polishing pad.

6. The method of claim 2, wherein the planarizing the surface of the to-be-processed film further comprises conditioning the polishing pad by bringing a dresser with a positive Rsk value into contact with the surface of the to-be-processed film.

7. The method of claim 1, wherein the planarizing the surface of the to-be-processed film comprises:
    forming a surface layer along the convex potion and concave potion on the to-be-processed film; and
    removing the surface layer on the convex portion while leaving the surface layer on the concave portion by a processing body in a processing solution for dissolving the to-be-processed film, and selectively dissolving the convex portion of the to-be-processed film by the processing solution by making the dissolution degree of the convex portion larger than the dissolution degree of the concave portion.

8. The method of claim 7, wherein the processing body comprises a resin material.

9. The method of claim 7, wherein the processing body comprises a catalyst material.

10. The method of claim 7, wherein the to-be-processed film comprises $SiO_2$, and the processing solution comprises fluoro hydrogen solution, ammonium fluoride solution, or strong alkaline solution.

11. The method of claim 7, wherein the surface layer is a layer of a surfactant.

12. The method of claim 11, wherein the surfactant comprises polyvinyl pyrrolidone or polyethyleneimine.

13. The method of claim 12, wherein the surfactant further comprises polyacrylic acid.

14. The method of claim 7, wherein the surface layer is a self-assembled monolayer.

15. The method of claim 7, wherein the surface layer is a water-repellent treated layer.

16. The method of claim 1, wherein the planarizing the surface of the to-be-processed film comprises:
    forming a surface layer on the to-be-processed film along the convex potion and concave potion, the surface layer being formed by bringing a processing solution containing a component for forming the surface layer into contact with the to-be-processed film; and
    removing the surface layer on the convex portion while leaving the surface layer on the concave portion by a processing body in a processing solution containing a component for dissolving the to-be-processed film, and selectively dissolving the convex portion of the to-be-processed film by the processing solution by making the dissolution degree of the convex portion larger than the dissolution degree of the concave portion.

17. The method of claim 1, wherein the layer is an air gap.

18. The method of claim 1, wherein the layer is a porous layer.

19. The method of claim 1, wherein the thickness of the to-be-processed film after the planarizing the surface of the to-be-processed film is 480 nm or more.

20. The method of claim 1, wherein the etching the planarized surface of the to-be-processed film is executed by RIE or wet etching.

* * * * *